(12) United States Patent
Messier et al.

(10) Patent No.: US 12,235,294 B2
(45) Date of Patent: Feb. 25, 2025

(54) CURRENT SENSOR ASSEMBLIES FOR LOW CURRENTS

(71) Applicant: Allegro MicroSystems, LLC, Manchester, NH (US)

(72) Inventors: Loïc André Messier, Vanzy (FR); Yannick Vuillermet, La Motte Servolex (FR); Andreas P. Friedrich, Metz-Tessy (FR)

(73) Assignee: Allegro MicroSystem, LLC, Manchester, NH (US)

( * ) Notice: Subject to any disclaimer, the term of this patent is extended or adjusted under 35 U.S.C. 154(b) by 0 days.

(21) Appl. No.: 18/644,470

(22) Filed: Apr. 24, 2024

(65) Prior Publication Data

US 2024/0272208 A1    Aug. 15, 2024

Related U.S. Application Data

(63) Continuation of application No. 17/659,385, filed on Apr. 15, 2022, now Pat. No. 11,994,541.

(51) Int. Cl.
*G01R 19/165* (2006.01)
*G01R 15/18* (2006.01)
(Continued)

(52) U.S. Cl.
CPC ..... *G01R 19/16504* (2013.01); *G01R 15/181* (2013.01); *G01R 33/072* (2013.01); *H05K 1/181* (2013.01); *H05K 2201/10151* (2013.01)

(58) Field of Classification Search
CPC ............ G01R 19/16504; G01R 15/181; G01R 33/072; G01R 33/0011; G01R 33/0017;
(Continued)

(56) References Cited

U.S. PATENT DOCUMENTS 4,236,832 A    12/1980 Komatsu et al.
4,283,643 A     8/1981 Levin
(Continued)

FOREIGN PATENT DOCUMENTS

CN    683469 A5    3/1994
CN    1501093 A    6/2004
(Continued)

OTHER PUBLICATIONS

"Utilization of GMR Materials. Analog Bridge Output Devices;"; NVE Corporation on website: www.nve.com/technical/explinations// Bridge.html., 3 pages.
(Continued)

*Primary Examiner* — Jermele M Hollington
*Assistant Examiner* — Zannatul Ferdous
(74) *Attorney, Agent, or Firm* — DALY, CROWLEY, MOFFORD & DURKEE, LLP

(57) ABSTRACT

A current sensor assembly can include: a coil structure having a first coil and a second coil connected in series, the coil structure configured to generate a differential magnetic field responsive to an electrical current passing through the first and second coils; a first magnetic field sensing element disposed proximate to the first coil and operable to generate a first signal responsive to the differential magnetic field passing through the first magnetic field sensing element in a first direction; a second magnetic field sensing element disposed proximate to the second coil and operable to generate a second signal responsive to the differential magnetic field passing through the second magnetic field sensing element in a second direction; and a circuit operable to subtract the first and second signals to generate a differential signal proportional to the electrical current.

19 Claims, 10 Drawing Sheets

(51) Int. Cl.
*G01R 33/07* (2006.01)
*H05K 1/18* (2006.01)

(58) Field of Classification Search
CPC .... G01R 33/091; G01R 15/207; H05K 1/181; H05K 2201/10151; H05K 1/0298; H05K 1/165

See application file for complete search history.

(56) References Cited

U.S. PATENT DOCUMENTS

| | | |
|---|---|---|
| 4,343,026 A | 8/1982 | Griffith et al. |
| 4,385,273 A | 5/1983 | Lienhard et al. |
| 4,438,347 A | 3/1984 | Gehring |
| 4,525,668 A | 6/1985 | Lienhard et al. |
| 4,596,950 A | 6/1986 | Lienhard et al. |
| 4,691,259 A | 9/1987 | Imakoshi et al. |
| 4,712,064 A | 12/1987 | Eckardt et al. |
| 4,752,733 A | 6/1988 | Petr et al. |
| 4,758,943 A | 7/1988 | Aström et al. |
| 4,760,285 A | 7/1988 | Nelson |
| 4,772,929 A | 9/1988 | Manchester |
| 4,823,075 A | 4/1989 | Alley |
| 4,833,406 A | 5/1989 | Foster |
| 4,847,584 A | 7/1989 | Pant |
| 4,922,606 A | 5/1990 | Alexander et al. |
| 4,926,116 A | 5/1990 | Talisa |
| 4,937,521 A | 6/1990 | Yoshino et al. |
| 4,939,448 A | 7/1990 | Gudel |
| 4,939,449 A | 7/1990 | Cattaneo et al. |
| 4,939,459 A | 7/1990 | Akachi et al. |
| 4,970,411 A | 11/1990 | Halg et al. |
| 5,041,780 A | 8/1991 | Rippel |
| 5,049,809 A | 9/1991 | Wakatsuki et al. |
| 5,218,279 A | 6/1993 | Takahashi et al. |
| 5,227,721 A | 7/1993 | Kataoka et al. |
| 5,247,202 A | 9/1993 | Popovic et al. |
| 5,247,278 A | 9/1993 | Pant et al. |
| 5,329,416 A | 7/1994 | Ushiyama et al. |
| 5,343,143 A | 8/1994 | Voisine et al. |
| 5,351,027 A | 9/1994 | Kawamata et al. |
| 5,412,255 A | 5/1995 | Wallrafen |
| 5,424,558 A | 6/1995 | Borden et al. |
| 5,442,283 A | 8/1995 | Vig et al. |
| 5,469,058 A | 11/1995 | Dunnam |
| 5,500,590 A | 3/1996 | Pant |
| 5,521,501 A | 5/1996 | Dettmann et al. |
| 5,561,368 A | 10/1996 | Dovek et al. |
| 5,570,034 A | 10/1996 | Needham et al. |
| 5,583,725 A | 12/1996 | Coffey et al. |
| 5,621,319 A | 4/1997 | Bilotti et al. |
| 5,621,377 A | 4/1997 | Dettmann et al. |
| 5,640,090 A | 6/1997 | Furuya et al. |
| 5,686,838 A | 11/1997 | Van den Berg |
| 5,686,879 A | 11/1997 | Schuhl et al. |
| 5,719,494 A | 2/1998 | Dettmann et al. |
| 5,831,426 A | 11/1998 | Black, Jr. et al. |
| 5,844,140 A | 12/1998 | Seale |
| 5,877,705 A | 3/1999 | Sampey |
| 5,883,567 A | 3/1999 | Mullins, Jr. |
| 5,896,030 A | 4/1999 | Hasken |
| 5,945,825 A | 8/1999 | Clemens |
| 5,952,825 A | 9/1999 | Wan |
| 6,002,553 A | 12/1999 | Stearns et al. |
| 6,011,770 A | 1/2000 | Tan |
| 6,031,273 A | 2/2000 | Torok et al. |
| 6,094,330 A | 7/2000 | Criniti et al. |
| 6,100,686 A | 8/2000 | Van Delden et al. |
| 6,175,296 B1 | 1/2001 | Tokunaga et al. |
| 6,184,679 B1 | 2/2001 | Popovic et al. |
| 6,300,617 B1 | 10/2001 | Daughton et al. |
| 6,315,875 B1 | 11/2001 | Sasaki |
| 6,329,818 B1 | 12/2001 | Tokunaga et al. |
| 6,331,773 B1 | 12/2001 | Engel |
| 6,351,506 B1 | 2/2002 | Lewicki |
| 6,356,068 B1 | 3/2002 | Steiner et al. |
| 6,392,478 B1 | 5/2002 | Mulder et al. |
| 6,392,852 B1 | 5/2002 | Sasaki |
| 6,404,191 B2 | 6/2002 | Daughton et al. |
| 6,424,018 B1 | 7/2002 | Ohtsuka |
| 6,426,620 B1 | 7/2002 | Taguchi et al. |
| 6,429,640 B1 | 8/2002 | Daughton et al. |
| 6,433,981 B1 | 8/2002 | Fletcher et al. |
| 6,436,748 B1 | 8/2002 | Forbes et al. |
| 6,437,558 B2 | 8/2002 | Li et al. |
| 6,459,255 B1 | 10/2002 | Tamai et al. |
| 6,462,531 B1 | 10/2002 | Ohtsuka |
| 6,462,541 B1 | 10/2002 | Wang et al. |
| 6,501,678 B1 | 12/2002 | Lenssen et al. |
| 6,545,457 B2 | 4/2003 | Goto et al. |
| 6,583,629 B1 | 6/2003 | Stokes et al. |
| 6,591,481 B2 | 7/2003 | Shimazawa et al. |
| 6,657,826 B2 | 12/2003 | Shimazawa et al. |
| 6,683,448 B1 | 1/2004 | Ohtsuka |
| 6,721,140 B2 | 4/2004 | Inoue et al. |
| 6,769,166 B1 | 8/2004 | Blanchard |
| 6,781,358 B2 | 8/2004 | Goto et al. |
| 6,781,359 B2 | 8/2004 | Stauth et al. |
| 6,791,313 B2 | 9/2004 | Ohtsuka |
| 6,812,687 B1 | 11/2004 | Ohtuska |
| 6,815,944 B2 | 11/2004 | Vig et al. |
| 6,841,989 B2 | 1/2005 | Goto et al. |
| 6,853,178 B2 | 2/2005 | Hayat-Dawoodi |
| 6,896,407 B2 | 2/2005 | Nomiyama et al. |
| 6,917,321 B1 | 7/2005 | Haurie et al. |
| 6,970,333 B2 | 11/2005 | Boeve |
| 6,989,665 B2 | 1/2006 | Goto |
| 7,026,808 B2 | 4/2006 | Vig et al. |
| 7,038,448 B2 | 5/2006 | Schott et al. |
| 7,075,287 B1 | 7/2006 | Mangtani et al. |
| 7,166,807 B2 | 1/2007 | Gagnon et al. |
| 7,190,784 B2 | 3/2007 | Li |
| 7,259,545 B2 | 8/2007 | Stauth et al. |
| 7,292,095 B2 | 11/2007 | Burt et al. |
| 7,319,319 B2 | 1/2008 | Jones et al. |
| 7,323,870 B2 | 1/2008 | Tatschl et al. |
| 7,325,175 B2 | 1/2008 | Momtaz |
| 7,336,064 B2 | 2/2008 | Ludwig et al. |
| 7,345,470 B2 | 3/2008 | Suzuki |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,495,624 B2 | 2/2009 | Daalmans |
| 7,518,354 B2 | 4/2009 | Stauth et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,764,118 B2 | 7/2010 | Kusuda et al. |
| 7,769,110 B2 | 8/2010 | Momtaz |
| 7,800,389 B2 | 9/2010 | Friedrich et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,128,549 B2 | 3/2012 | Testani et al. |
| 8,134,358 B2 | 3/2012 | Charlier et al. |
| 8,203,329 B2 | 6/2012 | Hohe et al. |
| 8,447,556 B2 | 5/2013 | Friedrich et al. |
| 8,542,010 B2 | 9/2013 | Cesaretti et al. |
| 8,692,546 B2 | 4/2014 | Cesaretti et al. |
| 8,818,749 B2 | 8/2014 | Friedrich et al. |
| 8,907,669 B2 | 12/2014 | Petrie |
| 9,081,041 B2 | 7/2015 | Friedrich et al. |
| 9,151,807 B2 | 10/2015 | Friedrich et al. |
| 10,074,939 B1 | 9/2018 | Briano |
| 10,725,100 B2 | 7/2020 | Milano et al. |
| 10,761,120 B2 | 9/2020 | Feucht et al. |
| 10,884,031 B2 | 1/2021 | Vuillermet et al. |
| 11,099,217 B2 | 8/2021 | Vuillermet et al. |
| 11,112,230 B2 | 9/2021 | Latham et al. |

(56) References Cited

U.S. PATENT DOCUMENTS

| | | |
|---|---|---|
| 11,366,141 B1 | 6/2022 | Daubert et al. |
| 11,513,141 B2 | 11/2022 | Vuillermet et al. |
| 11,994,541 B2 | 5/2024 | Messier et al. |
| 2002/0084923 A1 | 7/2002 | Li |
| 2002/0093332 A1 | 7/2002 | Schroeder et al. |
| 2002/0180433 A1 | 12/2002 | Van Zon et al. |
| 2003/0038675 A1 | 2/2003 | Gailus et al. |
| 2003/0102909 A1 | 6/2003 | Motz |
| 2003/0151406 A1 | 8/2003 | Wan et al. |
| 2004/0023064 A1 | 2/2004 | Ehresmann et al. |
| 2004/0155644 A1 | 8/2004 | Stauth et al. |
| 2004/0184196 A1 | 9/2004 | Jayasekara |
| 2005/0045359 A1 | 3/2005 | Doogue et al. |
| 2005/0073295 A1* | 4/2005 | Hastings ............... G01R 15/202 324/117 R |
| 2005/0246114 A1 | 11/2005 | Rannow et al. |
| 2006/0033487 A1 | 2/2006 | Nagano et al. |
| 2006/0077598 A1 | 4/2006 | Taylor et al. |
| 2006/0175674 A1 | 8/2006 | Taylor et al. |
| 2006/0202692 A1 | 9/2006 | Tatschl et al. |
| 2006/0255797 A1 | 11/2006 | Taylor et al. |
| 2007/0110199 A1 | 5/2007 | Momtaz et al. |
| 2007/0170533 A1 | 7/2007 | Doogue et al. |
| 2007/0247141 A1 | 10/2007 | Pastre et al. |
| 2007/0247146 A1 | 10/2007 | Stauth et al. |
| 2007/0285089 A1 | 12/2007 | Ibuki et al. |
| 2008/0094055 A1 | 4/2008 | Monreal et al. |
| 2008/0137784 A1 | 6/2008 | Krone |
| 2008/0238410 A1 | 10/2008 | Charlier et al. |
| 2009/0001964 A1 | 1/2009 | Strzalkowski et al. |
| 2009/0001972 A1 | 1/2009 | Fernandez et al. |
| 2009/0085706 A1 | 4/2009 | Baarman et al. |
| 2009/0212765 A1* | 8/2009 | Doogue ............ G01R 33/0041 324/202 |
| 2009/0315543 A1 | 12/2009 | Guo et al. |
| 2010/0211347 A1 | 8/2010 | Friedrich et al. |
| 2010/0301836 A1 | 12/2010 | Kern |
| 2011/0018533 A1 | 1/2011 | Cesaretti et al. |
| 2011/0048102 A1 | 3/2011 | Fernandez et al. |
| 2011/0298448 A1 | 12/2011 | Foletto et al. |
| 2012/0081110 A1 | 4/2012 | Racz |
| 2012/0274314 A1* | 11/2012 | Cesaretti ............ G01R 33/0017 324/252 |
| 2013/0093412 A1 | 4/2013 | Anelli et al. |
| 2013/0214774 A1 | 8/2013 | Cesaretti et al. |
| 2013/0265041 A1* | 10/2013 | Friedrich ............ G01R 15/207 324/260 |
| 2019/0229640 A1* | 7/2019 | Aichriedler ........... H02M 7/003 |
| 2022/0381805 A1 | 12/2022 | Zhao |

FOREIGN PATENT DOCUMENTS

| | | |
|---|---|---|
| CN | 200986484 Y | 12/2007 |
| DE | 42 12 737 C1 | 7/1993 |
| DE | 195 39 458 A1 | 4/1997 |
| DE | 196 06 826 A1 | 8/1997 |
| DE | 196 50 078 A1 | 6/1998 |
| DE | 10017374 B4 | 12/2000 |
| DE | 10159607 A1 | 9/2002 |
| DE | 10128150 C1 | 1/2003 |
| DE | 10155423 B4 | 5/2003 |
| DE | 10202287 C1 | 8/2003 |
| DE | 10222395 A1 | 12/2003 |
| DE | 103 14 602 A1 | 10/2004 |
| DE | 102004003369 A1 | 8/2005 |
| DE | 102004009267 B3 | 9/2005 |
| DE | 102004038847 B3 | 9/2005 |
| DE | 102004040079 B3 | 12/2005 |
| DE | 102005037905 A1 | 3/2006 |
| DE | 102004053551 A1 | 5/2006 |
| DE | 10 2005 047 413 A1 | 9/2006 |
| DE | 102006008257 A1 | 10/2006 |
| DE | 102006021774 A1 | 1/2007 |
| DE | 102005038655 B3 | 3/2007 |
| DE | 102005040539 B4 | 3/2007 |
| DE | 102005052688 A1 | 5/2007 |
| DE | 102006007770 A1 | 8/2007 |
| DE | 102006028698 B3 | 12/2007 |
| DE | 10 2006 037 226 A1 | 2/2008 |
| DE | 102006046736 B4 | 4/2008 |
| DE | 102006046739 B4 | 8/2008 |
| DE | 10 2007 041 230 B3 | 4/2009 |
| EP | 0 289 414 A2 | 11/1988 |
| EP | 0 289 414 A3 | 11/1988 |
| EP | 0 338 122 | 10/1989 |
| EP | 0 357 013 A2 | 3/1990 |
| EP | 0 357 013 A3 | 3/1990 |
| EP | 0 539 081 A1 | 4/1993 |
| EP | 0 710 850 A2 | 5/1996 |
| EP | 0 710 850 A3 | 5/1996 |
| EP | 1 225 453 A2 | 7/2002 |
| EP | 1 443 332 A1 | 8/2004 |
| EP | 1 637 898 A1 | 3/2006 |
| EP | 1 679 524 A1 | 7/2006 |
| EP | 1 691 204 A1 | 8/2006 |
| EP | 1 850 143 A1 | 10/2007 |
| EP | 1 865 331 A2 | 12/2007 |
| GB | 2 276 727 A | 10/1994 |
| JP | S 57187671 | 11/1982 |
| JP | SHO 61-48777 | 3/1986 |
| JP | 63/263782 A | 10/1988 |
| JP | H 02-238372 | 9/1990 |
| JP | 03-248611 | 11/1991 |
| JP | H 05-10979 | 1/1993 |
| JP | 9-166612 | 6/1997 |
| JP | 2002-082136 | 3/2002 |
| JP | 2004-177228 A | 6/2004 |
| JP | 2004/356338 A | 12/2004 |
| JP | 2006-123012 A | 5/2006 |
| JP | 2008-513762 A | 5/2008 |
| JP | 2011-052036 A | 7/2011 |
| JP | 2011185914 | 9/2011 |
| JP | 2015135267 | 7/2015 |
| WO | WO 96/02849 A1 | 2/1996 |
| WO | WO 03/019216 A1 | 3/2003 |
| WO | WO 03/107018 A1 | 12/2003 |
| WO | WO 2004/072672 | 8/2004 |
| WO | WO 2004/109725 A1 | 12/2004 |
| WO | WO 2006/044031 A1 | 4/2006 |
| WO | WO 2006/056829 | 6/2006 |
| WO | WO 2006/083479 A1 | 8/2006 |
| WO | WO 2006/136577 A1 | 12/2006 |
| WO | WO 2007/087121 A2 | 8/2007 |
| WO | WO 2007/087121 A3 | 8/2007 |
| WO | WO 2007/138508 A1 | 12/2007 |
| WO | WO 2007/147760 A2 | 12/2007 |
| WO | WO 2008/048379 A1 | 4/2008 |
| WO | WO 2009/108422 A2 | 9/2009 |
| WO | WO 2010/096367 A1 | 8/2010 |
| WO | WO 2011/011479 | 1/2011 |

OTHER PUBLICATIONS

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 pages.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN: 0-7803-8692-2; 4 pages.

Ausserlechner; "Limits of Offset Cancellation by the Principle of Spinning Current Hall Probe;" Proceedings of IEEE Sensors; Oct. 2004; 4 pages.

Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.

Bahreyni, et al.; "A Resonant Micromachined Magnetic Field Sensor;" IEEE Sensors Journal; vol. 7, No. 9, Sep. 2007; 9 pages.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.

(56) References Cited

OTHER PUBLICATIONS

Baschirotto et al.; "Development and Analysis of PCB Vector 2-D Magnetic Field Sensor System for Electronic Compass;" IEEE Sensors Journal vol. 6, No. 2; Apr. 2006; 7 pages.

Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.

Blagojevic et al.; "FD SOI Hall Sensor Electronics Interfaces for Energy Measurement;" Microelectronics Journal 37; Sep. 2006; 8 pages.

Cesaretti et al.; "Effect of Stress Due to Plastic Package Moisture Absorption in Hall Sensors;" IEEE Transactions on Magnetics, vol. 45, No. 16; Oct. 2009; 4 pages.

Data Sheet; "High-Speed Digital Isolators, AduM1100AR/ AduM1100BR;" as published by Analog Devices, Inc.; 2001, 12 pages.

Demierre, et al.; "Reference Magnetic Actuator for Self-Calibration of a Very Small Hall Sensor Array;" Sensors and Actuators A97-98; Apr. 2002; 8 pages.

Frick, et al.; "CMOS Microsystem for AC Current Measurement with Galvanic Isolation;" IEEE Sensors Journal; vol. 3, No. 6; Dec. 2003; 9 pages.

Halg; "Piezo-Hall Coefficients of n-Type Silicon;" Journal of Applied Physics; vol. 64, No. 1; Jul. 1, 1988; 7 pages.

Hirota et al.; "Giant Magneto-Resistance Devices;" Springer Series in Surface Sciences, 40; ISBN-10: 3540418199; ISBN-13: 9783540418191 pp. 10-17, 9 pages.

Hosticka; "CMOS Sensor Systems;" Sensors and Actuators A66; Apr. 1998; 7 pages.

Kanda et al.; "The Piezo-Hall Effect in n-Silicon;" 22nd International Conference on the Physics of Semiconductors; vol. 1, Jan. 1995; 4 pages.

Kayal et al.; "Automatic Calibration of Hall Sensor Microsystems;" Microelectronics Journal 37; Sep. 2006; 7 pages.

Kammerer et al.: "A Hall effect sensors network insensitive to mechanical stress;" Proceedings of IEEE Sensors; vol. 3, Oct. 2004; 4 pages.

Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; 4 pages.

Manic et al.; "Short and Long-Term Stability Problems of Hall Plates in Plastic Packages;" IEEE $38^{th}$ Annual International Reliability Physics Symposium; Apr. 2000;6 pages.

Manic; "Drift in Silicon Integrated Sensors and Circuits Due to the Thermo-Mechanical Stresses;" Lausanne, École Polytechnique Fédérale De Lausanne 2000; Part 1, 74 pages.

Manic; "Drift in Silicon Integrated Sensors and Circuits Due to the Thermo-Mechanical Stresses;" Lausanne, École Polytechnique Fédérale De Lausanne 2000; Part 2, 102 pages.

Motz et al.; "An Integrated Magnetic Sensor with Two Continuous-Time AZ-Converters and Stress Compensation Capability;" IEEE International Solid-State Circuits Conference; Digest of Technical Papers; Feb. 6, 2006; ISBN: 1-4244-0079-1; 7 pages.

Motz, et al.; "A Chopped Hall Sensor with Small Jitter and Programmable "True Power-On" Function;" IEEE Journal of Solid-State Circuits; vol. 40, No. 7; Jul. 2005; 8 pages.

Motz, et al.; "An Integrated Hall Sensor Platform Design for Position, Angle and Current Sensing;" IEEE Sensors 2006; Exco, Daegu, Korea / Oct. 22-25, 2006; 4 pages.

Munter; "A Low-offset Spinning-current Hall Plate;" Sensors and Actuators A21-A23; 1990; 4 pages.

Munter; "Electronic Circuitry for a Smart Spinning-current Hall Plate with Low Offset;" Sensors and Actuators A; Jun. 1991;.5 pages.

Partin et al.; "Temperature Stable Hall Effect Sensors;" IEEE Sensors Journal, vol. 6, No. 1; Feb. 2006; pp. 106-110.

Partin, et al.; "Temperature Stable Hall Effect Sensors;" IEEE Sensors Journal, vol. 6, No. 1, Feb. 2006; 5 pages.

Pastre, et al.; "A Hall Sensor Analog Front End for Current Measurement with Continuous Gain Calibration;" IEEE Sensors Journal; vol. 7, No. 5; May 2007; 8 pages.

Pastre, et al.; "A Hall Sensor-Based Current Measurement Microsystem With Continuous Gain Calibration;" Research in Microelectronics and Electronics, IEEE vol. 2; Jul. 25; 2005; ISBN: 0-7803-9345-7; 4 pages.

Pernia et al.; "Characteristics and Design of a Current Sensor Using Multilayer Co/Ni Structures;" IEEE, 1998, 6 pages.

Popovic; "Sensor Microsystems;" Proc. 20th International Conference on Microelectronics (MWIL 95); vol. 2, NIS, Serbia, 12-14; Sep. 1995; 7 pages.

Randhawa; "Monolithic Integrated Hall Devices in Silicon Circuits;" Microelectronics Journal; vol. 12, No. 6; Sep. 14-17, 1981; 6 pages.

Ruther et al.; "Integrated CMOS-Based Sensor Array for Mechanical Stress Mapping;" 5th IEEE Conference on Sensors, Oct. 2007; 4 pages.

Ruther et al.; "Theromagnetic Residual Offset in Integrated Hall Plates;" IEEE Sensors Journal; vol. 3, No. 6; Dec. 2003; 7 pages.

Sargent; "Switched-capacitor IC controls feedback loop;" EDN; Design Ideas; Feb. 17, 2000; 2 pages.

Schneider, et al.; "Temperature Calibration of CMOS Magnetic Vector Probe for Contactless Angle Measurement System;" IEDM; Dec. 1996; 4 Pages.

Schott et al.; "Linearizing Integrated Hall Devices;" 1997 International Conference on Solid-State Sensors and Actuators, Jun. 16-19, 1997; 4 Pages.

Schott, et al.; "CMOS Single-Chip Electronic Compass with Microcontroller;" IEEE Journal of Solid-State Circuits; vol. 42, No. 12; Dec. 2007; 11 pages.

Simon et al.; "Autocalibration of Silicon Hall Devices;" $8^{th}$ International Conference on Solid-State Sensors and Actuators; vol. 2; Jun. 25, 1995; 4 pages.

Steiner et al.; Offset Reduction in Hall Devices by Continuous Spinning Current Method; Sensors and Actuators A66; 1998; 6 pages.

Steiner: "Double-Hall Sensor with Self-Compensated Offset;" Electron Devices Meeting; IDSM '97 Technical Digest; Dec. 7-10, 1997; 4 pages.

Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.

Takenaga et al.; "High-Temperture Operations of Rotation Angle Sensors with Spin-Valve-Type Magnetic Tunnel Junctions;" IEEE Transactions on Magnetics; vol. 41, No. 10; Oct. 2005; 3 pages.

Taylor, et al.; "A Spin-Valve Based SOIC8 Current Sensor;" Allegro Microsystems, Inc. internal document; Aug. 17, 2006; 4 pages.

Tian et al.; "Multiple Sensors on Pulsed Eddy-Current Detection for 3-D Subsurface Crack Assessment;" IEEE Sensors Journal, vol. 5, No. 1; Feb. 2005; 7 pages.

Trontelj et al.; "CMOS Integrated Magnetic Field Source Used as a Reference in Magnetic Field Sensors on Common Substrate;" WEP 1-6; IMTC; May 1994; 3 pages.

Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.

Zou et al.; "Three-Dimensional Die Surface Stress Measurements in Delaminated and Non-Delaminated Plastic Packages;" 48th Electronic Components and Technology Conference; May 25, 1998; 12 pages.

PCT Search Report and Written Opinion of the ISA for PCT/US2006/ 000363 dated Nov. 5, 2006, 14 pages.

PCT International Preliminary Report on Patentability for PCT/ US2006/000636 dated Aug. 16, 2007, 10 pages.

Office Action/Restriction Requirement dated May 15, 2008 for U.S. Appl. No. 11/335,944; 5 sheets.

Response/Amendment to Restriction Requirement dated May 15, 2008 and filed on May 30, 2008 for U.S. Appl. No. 11/335,944; 1 sheet.

(56) References Cited

OTHER PUBLICATIONS

Office Action dated Apr. 6, 2009 for U.S. Appl. No. 11/335,944; 18 sheets.
Response/Amendment to Office Action dated Apr. 6, 2009 and filed on Jul. 6, 2009 for U.S. Appl. No. 11/335,944; 17 sheets.
Office Action dated Nov. 16, 2009 for U.S. Appl. No. 11/335,944; 16 sheets.
Response/Amendment to Office Action dated Nov. 16, 2009 and filed on Dec. 23, 2009 for U.S. Appl. No. 11/335,944; 19 sheets.
Notice of Allowance dated Jan. 28, 2010 for U.S. Appl. No. 11/335,944; 6 sheets.
Request for Continued Examination dated Feb. 23, 2010 for U.S. Appl. No. 11/335,944; 1 sheet.
Notice of Allowance dated Mar. 23, 2010 for U.S. Appl. No. 11/335,944; 6 sheets.
Amendment Under 37 C.F.R. §1.312 filed on May 20, 2010 Notice of Allowance dated Jan. 28, 2010 for U.S. Appl. No. 11/335,944; 7 sheets.
PCT Notification Concerning Transmittal of International Preliminary Report on Patentability for PCT/US2007/000093; 9 pages.
PCT Search Report and Written Opinion of ISA for PCT/US2007/000093 dated Feb. 5, 2008, 13 pages.
EP Official Communication dated Dec. 5, 2008 for EP Pat. App. No. 07 716 253.5; 3 sheets.
EP Response to Official Communication dated Dec. 5, 2008 and filed on Jun. 8, 2009 EP Pat. App. No. 07 716 253.5; 14 sheets.
U.S. Appl. No. 12/792,245, filed Jun. 2, 2010; 91 sheets.
PCT Search Report and Written Opinion of the ISA for PCT/US2009/044614 dated May 20, 2009, 14 pages.
U.S. Pat. No. 7,923,996; issued on Apr. 12, 2011; Part 1 of 5; 300 pages.
U.S. Pat. No. 7,923,996; issued on Apr. 12, 2011; Part 2 of 5; 300 pages.
U.S. Pat. No. 7,923,996; issued on Apr. 12, 2011; Part 3 of 5; 300 pages.
U.S. Pat. No. 7,923,996; issued on Apr. 12, 2011; Part 4 of 5; 300 pages.
U.S. Pat. No. 7,923,996; issued on Apr. 12, 2011; Part 5 of 5; 279 pages.
Notice of Allowance; dated Feb. 11, 2011; for U.S. Appl. No. 12/037,393; 8 pages.
PCT Search Report and Written Opinion of the ISA for PCT/US2009/031776 dated Oct. 23, 2009; 16 pages.
PCT International Preliminary Report on Patentability and Written Opinion mailed Sep. 10, 2010 for PCT/US2009/031776; 10 pages.
Letter from Yuasa & Hara; dated May 27, 2013; for JP Pat. App. No. 2010-547666; 2 pages.
Japanese Notice of Reasons for Rejection (English translation); dated Apr. 4, 2013; for JP Pat. App. No. 2010-547666; 4 pages.
Letter from Yuasa and Hara; dated Oct. 8, 2013; for Japanese Pat. App. No. 2010-547666; 2 pages.
Argument and Amendment (in Japanese); dated Jul. 3, 2013; for Japanese Pat. App. No. 2010-547666; 11 pages.
Claims for Argument and Amendment (in English); dated Jul. 3, 2013; for Japanese Pat. App. No. 2010-547666; 5 pages.
Japanese Notice of Reasons for Rejection (English translation) dated Nov. 26, 2013; for JP Pat. App. No. 2010-547666; 2 pages.
Letter from NTD Patent & Trademark Agency Limited; dated Oct. 10, 2012; for Chinese Pat. App. No. 200980106535.4; 13 pages.
Chinese Office Action; dated Aug. 29, 2012; with English Translation for Chinese Pat. App. No. 200980106535.4; 8 pages.
Letter to NTD Patent and Trademark Agency Ltd.; dated Dec. 11, 2012; with instructions to file Response to Official Action; for Chinese Pat. App. No. 200980106535.4; 3 pages.
Letter from NTD Patent and Trademark Agency Ltd.; dated Jan. 19, 2013; enclosing Response to Official Action; for Chinese Pat. App. No. 200980106535.4; 13 pages.
Translated Chinese Office Action dated Apr. 15, 2013; for CN Pat. App. No. 200980106565.4; 9 pages.
Letter to NTD Patent and Trademark Agency; dated Jun. 19, 2013; for Chinese Pat. App. No. 200980106535.4; 11 pages.
Letter from NTD Patent and Trademark Agency; dated Jul. 11, 2013; for Chinese Pat. App. No. 200980106535.4; 1 page.
Chinese Response to Office Action; Jun. 27, 2013; for Chinese Pat. App. No. 200980106535.4; 21 pages.
Chinese Office Action dated Nov. 7, 2013 (w/English translation); for Chinese Pat. App. No. 200980106535.4; 9 pages.
Letter to NTD Patent and Trademark Agency, Ltd. dated Dec. 16, 2013; for Chinese Pat. App. No. 200980106535.4; 10 pages.
Letter from NTD Patent and Trademark Agency, Ltd. dated Jan. 7, 2014; for Chinese Pat. App. No. 200980106535.4; 1 page.
Response to Office Action received Jan. 7, 2014; for Chinese Pat. App. No. 200980106535.4; 11 pages.
U.S. Pat. No. 8,030,918; issued on Oct. 4, 2011; 534 pages.
Office Action; dated Feb. 2, 2011; for U.S. Appl. No. 12/959,672; 13 pages.
Response filed May 24, 2011 to Office Action dated Feb. 2, 2011; for U.S. Appl. No. 12/959,672; 8 pages.
Office Action dated Jul. 6, 2012; for U.S. Appl. No. 12/706,318; filed on Feb. 16, 2010; 29 pages.
U.S. Notice of Allowance; dated Dec. 10, 2012; for U.S. Appl. No. 12/706,318; 9 pages.
U.S. Appl. No. 12/706,318, filed Feb. 16, 2010; Part 1 of 9; 350 pages.
U.S. Appl. No. 12/706,318, filed Feb. 16, 2010; Part 2 of 9; 350 pages.
U.S. Appl. No. 12/706,318, filed Feb. 16, 2010; Part 3 of 9; 350 pages.
U.S. Appl. No. 12/706,318, filed Feb. 16, 2010; Part 4 of 9; 200 pages.
U.S. Appl. No. 12/706,318, filed Feb. 16, 2010; Part 5 of 9; 150 pages.
U.S. Appl. No. 12/706,318, filed Feb. 16, 2010; Part 6 of 9; 350 pages.
U.S. Appl. No. 12/706,318, filed Feb. 16, 2010; Part 7 of 9; 200 pages.
U.S. Appl. No. 12/706,318, filed Feb. 16, 2010; Part 8 of 9; 150 pages.
U.S. Appl. No. 12/706,318, filed Feb. 16, 2010; Part 9 of 9; 101 pages.
PCT Search Report and Written Opinion of the ISA for PCT/US2010/024256 dated Aug. 11, 2010; 14 pages.
PCT International Preliminary Report on Patentability and Written Opinion of the ISA for PCT Pat. App. No. PCT/US2010/024256; dated Sep. 1, 2011; 9 pages.
German Office Action; dated Sep. 23, 2013; for German Pat. App. No. 11 2010 000 848.5; 12 pages.
Letter to Kuhnen & Wacker dated Jan. 20, 2014, with enclosures; for DE Pat. App. No. 112010000848.5; 4 pages.
Office Action dated Jun. 12, 2013; for U.S. Appl. No. 13/743,451; 24 pages.
Response filed Oct. 8, 2013; to Office Action dated Jun. 12, 2013; for U.S. Appl. No. 13/743,451; 12 pages.
Notice of Allowance dated Dec. 24, 2013; for U.S. Appl. No. 13/743,451; 24 pages.
Preliminary Amendment; dated Mar. 7, 2012; for U.S. Appl. No. 12/840,324; 7 pages.
Office Action; dated Sep. 11, 2012; U.S. Appl. No. 12/840,324; 17 pages.
Response filed Dec. 10, 2012; to Office Action; dated Sep. 11, 2012; U.S. Appl. No. 12/840,324; 15 pages.
Office Action; dated Feb. 12, 2013; for U.S. Appl. No. 12/840,324; 19 pages.
Response filed May 12, 2013; to Office Action; dated Feb. 12, 2013; for U.S. Appl. No. 12/840,324; 12 pages.
Notice of Allowance; dated May 24, 2013; for U.S. Appl. No. 12/840,324; 12 pages.
Corrected Notice of Allowability; dated Jul. 17, 2013; for U.S. Appl. No. 12/840,324; 7 pages.
Corrected Notice of Allowability; dated Aug. 9, 2013; for U.S. Appl. No. 12/840,324; 6 pages.

(56) References Cited

OTHER PUBLICATIONS

PCT Search Report and Written Opinion of the ISA for PCT/US2010/042694 dated Sep. 27, 2010; 16 pages.
PCT International Preliminary Report on Patentability and Written Opinion of the ISA; dated Feb. 2, 2012; for PCT Pat. App. No. PCT/US2010/042694; 11 pages.
EP Official Communication; dated Feb. 23, 2012; for EP. Pat. App. No. 10739429.8; 2 pages.
European Response to Written Opinion; dated Sep. 4, 2012; for European Pat. App. No. 10739429.8; 21 pages.
European Notice of Allowance; dated Jan. 4, 2013; for European Pat. App. No. 10 739 429.8; 5 pages.
European Decision to Grant a European Patent; dated Sep. 5, 2013; for European Pat. App. No. 10739429.8; 2 pages.
Letter from Yuasa and Hara; dated Aug. 6, 2013; for Japanese Pat. App. No. 2012-521746; 6 pages.
Japanese Amendment; dated Jun. 12, 2013; for Japanese Pat. App. No. 2012-521746; 5 pages.
Notice of Allowance dated Nov. 14, 2013 for U.S. Appl. No. 13/969,702; 12 pages.
European Search Report; dated Jul. 4, 2013; for EP Pat. App. No. 13169661.9; 11 pages.
Office Action dated Jun. 11, 2013; for U.S. Appl. No. 13/095,371; 31 pages.
Notice of Allowance dated Oct. 28, 2013; for U.S. Appl. No. 13/095,971; 19 pages.
PCT Search Report and Written Opinion of the ISA for PCT Pat. App. No. PCT/US2012/032315; dated Jun. 22, 2012; 18 pages.
PCT International Preliminary Report on Patentability and Written Opinion of the ISA dated Nov. 7, 2013; for PCT Pat. App. No. PCT/US2012/032315; 13 pages.
PCT Search Report and Written Opinion; dated May 27, 2013; for PCT Pat. App. No. PCT/US2013/021143; 13 pages.
U.S. Appl. No. 18/187,919, filed Mar. 22, 2023, Lassalle-Balier et al.

* cited by examiner

CURRENT SENSOR ASSEMBLIES FOR LOW CURRENTS

CROSS REFERENCE TO RELATED APPLICATION

This application is a continuation of, and claims priority to and the benefit of U.S. patent application Ser. No. 17/659,385, entitled, "Current Sensor Assemblies for Low Currents," filed on Apr. 15, 2022, the entire content of which is incorporated herein by reference.

BACKGROUND

Various types of electrical current sensors are known in the art. Magnetic field current sensors include one or more magnetic field sensing elements positioned near a conductor to sense a magnetic field generated by an electrical current flowing through the conductor. In some arrangements, a magnetic field current sensor can generate an output signal having a magnitude proportional to the magnetic field induced by the current through the conductor. In other arrangements, a magnetic field sensor can generate an output signal having a magnitude proportional to the difference in magnetic fields induced by two currents following through two different conductors.

Current sensors are used in many applications including automotive, industrial, and other safety-critical applications. The overall safety of systems and devices that utilize current sensors can depend on the accuracy and reliability of the current sensors.

SUMMARY

In many current sensing applications, such as measuring battery leakage, the current to be measured may be in the range of hundreds of milliampere to below five amperes. With conventional current sensor assemblies, it can be challenging to measure such a "low" current accurately due to the relatively weak magnetic field induced by the current flowing through a conductor, resistance/inductance constraints, and/or cost constraints.

Described herein are embodiments of current sensors and current sensor assemblies that can be used to accurately measure low currents while being cost-effective. Disclosed embodiments include conductive coil or loop structures that can be formed upon printed circuit boards (PCBs) that are assembled with differential magnetic field sensors, or that can be formed as part of the differential magnetic field sensors themselves. In addition to low current sensing applications, certain embodiments may be suitable for use in differential current sensing applications, such as detecting current leak.

According to an aspect of the disclosure, a current sensor assembly may include: a coil structure having a first coil and a second coil connected in series, the coil structure configured to generate a differential magnetic field responsive to an electrical current passing through the first and second coils; a first magnetic field sensing element disposed proximate to the first coil and operable to generate a first signal responsive to the differential magnetic field passing through the first magnetic field sensing element in a first direction; a second magnetic field sensing element disposed proximate to the second coil and operable to generate a second signal responsive to the differential magnetic field passing through the second magnetic field sensing element in a second direction; and a circuit operable to subtract the first and second signals to generate a differential signal proportional to the electrical current.

In some embodiments, the coil structure can be formed upon a printed circuit board (PCB) and the first and second magnetic field sensing elements can be disposed over the PCB.

In some embodiments, the first coil and the second coil can be formed upon a first layer of the PCB and the first coil and the second coil may be connected by a conductive path formed upon a second layer of the PCB. In some embodiments, the PCB may include a first via to connect the first coil to the conductive path and a second via to connect the second coil to the conductive path. In some embodiments, the coil structure can further have a third coil and a fourth coil configured to contribute to the differential magnetic field responsive to the electrical current passing through the third and fourth coils.

In some embodiments, the third and fourth coils may be formed upon the second layer of the PCB and connected to the first and second coils, respectively, by vias of the PCB. In some embodiments, the coil structure can include a plurality of coils including at least the first and second coils, and at least two coils from the plurality of coils may be formed on different layers of the PCB and interconnected by vias. In some embodiments, the first magnetic field sensing element, the second magnetic field sensing element, and the circuit may be provided within an integrated circuit (IC) package disposed over the PCB.

In some embodiments, the first and second magnetic field sensing elements can include planar Hall elements. In some embodiments, the first and second magnetic field sensing elements can include vertical Hall elements. In some embodiments, the current sensor may further include: a third magnetic field sensing element disposed proximate to the first coil and operable to generate a third signal responsive to the differential magnetic field passing through the third magnetic field sensing element; and a fourth magnetic field sensing element disposed proximate to the second coil and operable to generate a fourth signal responsive to the differential magnetic field passing through the fourth magnetic field sensing element, and the circuit can be further operable generate the differential signal using the third and fourth signals. In some embodiments, the third and fourth magnetic field sensing elements can include vertical Hall elements.

In some embodiments, the current sensor assembly may further include one or more magnetic flux concentrators operable to influence the differential magnetic field to pass through the first magnetic field sensing element in the first direction and to influence the differential magnetic field to pass through the second magnetic field sensing element in the second direction. In some embodiments, the one or more magnetic flux concentrators may include a first magnetic flux concentrators disposed proximate to the first magnetic field sensing element and a second magnetic flux concentrators disposed proximate to the second magnetic field sensing element. In some embodiments, the one or more magnetic flux concentrators may include a single magnetic flux concentrator disposed proximate to both the first and second magnetic field sensing elements.

In some embodiments, the circuit may be provided with a die, and the first magnetic field sensing element, the second magnetic field sensing element, and the die may be over-molded onto a PCB onto which the coil structure is formed. In some embodiments, the circuit may be provided with a die, and the first magnetic field sensing element, the second magnetic field sensing element, the die, and the coil structure may be formed within an integrated circuit (IC) package.

According to another aspect of the disclosure, a current sensor assembly can include: a first coil structure configured to generate a first magnetic field responsive to a first electrical current passing through the first coil structure; a second coil structure configured to generate a second magnetic field responsive to a first electrical current passing through the second coil structure; a first magnetic field sensing element disposed proximate to the first coil structure and operable to generate a first signal responsive to the first magnetic field passing through the first magnetic field sensing element in a direction; a second magnetic field sensing element disposed proximate to the second coil structure and operable to generate a second signal responsive to the second magnetic field passing through the second magnetic field sensing element in the same direction; and a circuit operable to subtract the first and second signals to generate a differential signal proportional to a difference between the first and second electrical currents.

According to another aspect of the disclosure, a current sensor assembly may include: a plurality of magnetic field sensing elements disposed on a substrate; a conductive path formed onto the substrate and arranged to loop around ones of the plurality of magnetic field sensing elements to generate a magnetic field about the magnetic field sensing elements responsive to an electrical current passing through the conductive path, wherein at least magnetic field passes through at least one of the magnetic field sensing elements in a first direction and at least another one of the magnetic field sensing elements in a second direction; and one or more differential circuits operable to subtract signals generated by the plurality of magnetic field sensing elements and to generate one or more differential signals proportional to the electrical current.

In some embodiments, a first pair of the plurality of magnetic field sensing elements can be connected to a first one of the one or more differential circuits and a second pair of the plurality of magnetic field sensing elements can be connected to a second one of the one or more differential circuits. In some embodiments, a first two or more of the plurality of magnetic field sensing elements can be connected together, a second two or more of the plurality of magnetic field sensing elements can be connected together, and the first two or more and the second two or more of the plurality of magnetic field sensing elements can be connected to a same one of the one or more differential circuits.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1:
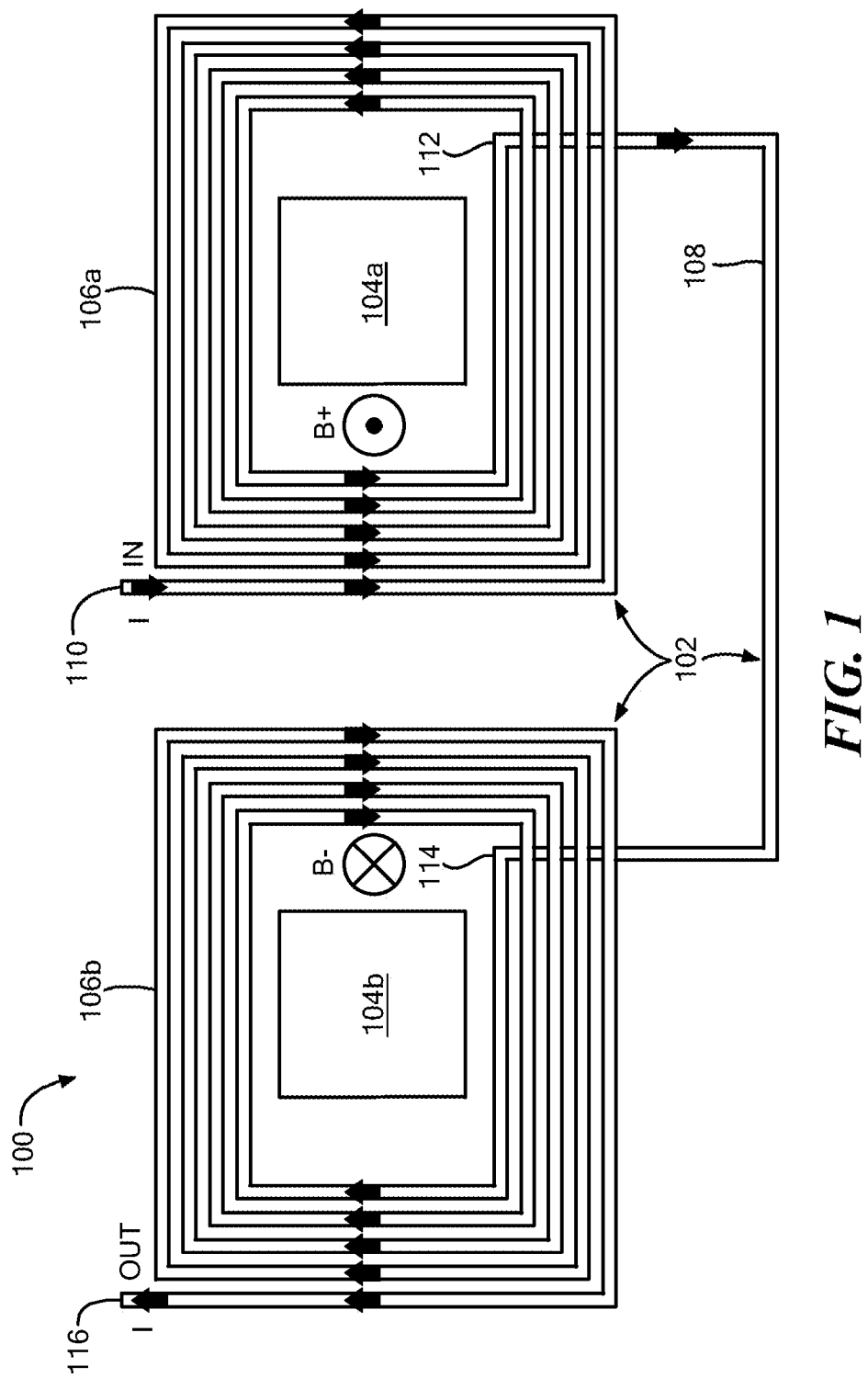
FIG. 1 is a diagram showing a top view of a current sensor assembly including a dual coil structure and two magnetic field sensing elements disposed proximate thereto, according to embodiments of the present disclosure.

Referring to FIG. 1, a current sensor assembly 100 can include a dual coil structure 102 and two magnetic field sensing elements 104a, 104b disposed proximate thereto, according to embodiments of the present disclosure. The illustrative coil structure 102 can include a first coil 106a and a second coil 106b connected in series by a conductive path (or "return path") 108. The coils 106a, 106b and return path 108 may be formed from any electrically conductive material, such as copper or another metal. As shown, first coil 106a may wind/loop one or more times in a counter-clockwise direction starting from an outer terminal 110 and ending at an inner terminal 112. Second coil 106b may wind/loop one or more times in a clockwise direction starting from an inner terminal 114 and ending at an outer terminal 116. The inner terminals 112, 114 may be connected to opposite ends of the return path 108, as shown.

The number of windings in the first and second coils 106a, 106b, along with the dimensions and shapes of the windings, may be selected according to the requirements of a particular application in which the current sensor assembly 100 is to be used. In general, increasing the number of coil windings will result in increased magnetic coupling factor (or "gain"), while also resulting in increased impedance through the conductive path. The term "magnetic coupling factor" refers to the strength of a magnetic field generated by a current flowing through a conductive coil or loop structure divided by the magnitude of the current. In some examples, magnetic coupling factor may be expressed in units of Gauss (G)/Ampere (A). Thus, for example, if an application involves the sensing of particularly low currents (e.g., in the range of hundreds of milliampere), then the number of coil windings may be increased to increase the magnetic coupling factor. As another example, if an application requires low impedance, then the number of coils may be decreased. The structures and techniques sought to be protected herein are not limited to the coil shapes and dimensions illustrated in FIG. 1. For example, in some embodiments, first and second coils 106a, 106b may be circular, rectangular, triangular, or of another shape. Likewise, the length, width, and trace thickness of the coils 106a, 106b may vary.

The outer terminals 110, 116 may constitute a port that can be connected to external circuitry (e.g., a current source) that carries an electrical current to be measured. For example, coil structure 102 may be connected to an external circuitry such that a current "I" flows into the outer terminal 110 of the first coil, counter-clockwise through the first coil 106a, through the return path 108, clockwise through the second coil 106b, and out of the outer terminal 116 of the second coil 106b. In this way, the coil structure 102 generates a differential magnetic field responsive to an electrical current flowing between the outer terminals 110, 116. That is, current flowing through the first coil 106a generates (or "induces") a first magnetic field, B+, having a first direction, whereas the current flowing through the second coil 106b generates a second magnetic field, B−, having a second, opposite direction. In the example of FIG. 1, first magnetic field, B+, is directed out from the page and second magnetic field, B−, is directed into the page. In this arrangement, outer terminal 110 may be referred to as an input terminal/connection and outer terminal 116 may be referred to as an output terminal/connection. In some embodiments, the direction of current flow—and thus the directions of the magnetic fields—may be reversed.

The magnetic field sensing elements 104a, 104b may be configured to generate signals responsive to the differential magnetic field. In more detail, first magnetic field sensing element 104a may be configured to generate a first signal responsive to the first magnetic field, B+, passing therethrough in a first direction and second magnetic field sensing element 104b may be configured to generate a second signal responsive to the second magnetic field, B−, passing therethrough in the second, opposite direction.

As used herein, the term "magnetic field sensing element" is used to describe a variety of electronic elements that can sense a magnetic field. A magnetic field sensing element can be, but is not limited to, a Hall effect element, a magnetoresistance element, or a magneto-transistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). A magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Certain embodiments disclosed herein may be shown as having planar Hall elements. However, other types of magnetic field sensing elements may be used in some cases. For example, planar Hall elements may be replaced with and/or used in combination with vertical Hall elements or magnetoresistance elements, which can be disposed upon substrates in a manner such that they are responsive to the relevant magnetic fields.

Referring again to FIG. 1, magnetic field sensing elements 104a, 104b may have axes of sensitivity perpendicular to the page of FIG. 1. In some embodiments, magnetic field sensing elements 104a, 104b may be provided as Hall elements, such as planar Hall elements.

Figure 2:
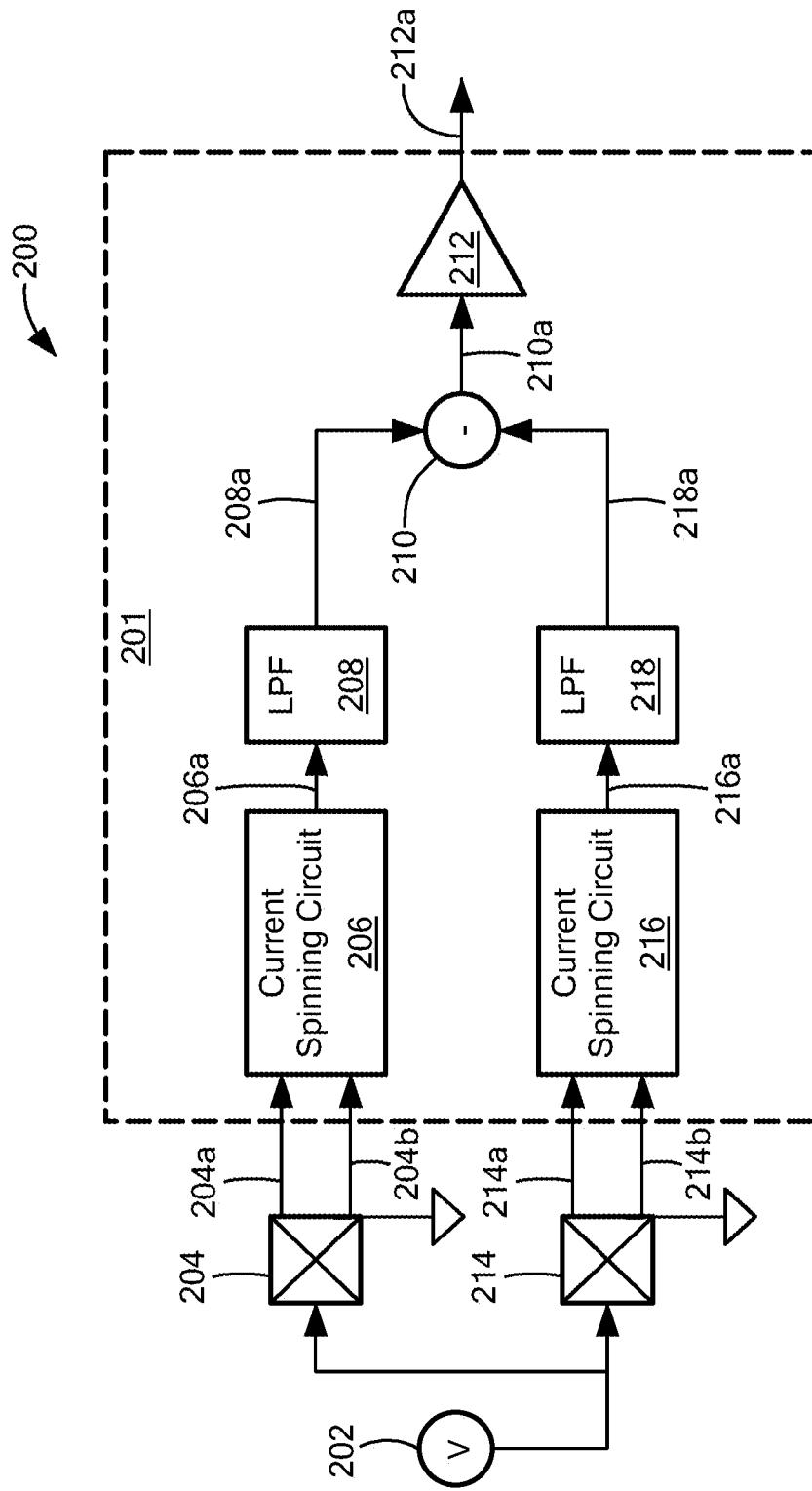
FIG. 2 is a block diagram of a current sensor that can be used within a current sensor assembly, according to embodiments of the present disclosure.

Magnetic field sensing elements 104a, 104b may be provided as part of a current sensor that includes an electronic circuit (not shown), all disposed upon a common substrate (also not shown), such as a substrate comprising a semiconductor material. The circuit may be operable to receive the first signal generated by the first magnetic field sensing element 104a and the second signal generated by the second magnetic field sensing element 104b, and to generate a differential signal proportional to the electrical current flowing through the coil structure 102 (e.g., by subtracting the first and second signals). The current sensor circuit may be configured to perform other signal processing, such as current spinning, filtering, an amplification. FIG. 2 shows an example of a current sensor within which magnetic field sensing elements 104a, 104b may be provided. That is, the illustrative current sensor of FIG. 2 may be included within the assembly 100.

As used herein, the term "current sensor" can refer to one or more magnetic field sensing elements and electronic circuitry configured to process signals generated thereby. The term "current sensor assembly" can refer to a current sensor combined with a conductive coil or loop structure for carrying a current to be sensed by the current sensor.

In some embodiments, coil structure 102 may be formed upon or within a printed circuit board (PCB), and magnetic field sensing elements 104a, 104b and the sensor circuitry may be formed on a die and packaged within an integrated circuit (IC) package or chip (referred to herein as the "current sensor package"). The current sensor package may be disposed over the PCB to form the current sensor assembly 100. For example, the current sensor package may be surface mounted over the PCB using adhesive or mechanical fasteners. This and other means of packaging disclosed current sensor assemblies are discussed further below.

Figure 1A:
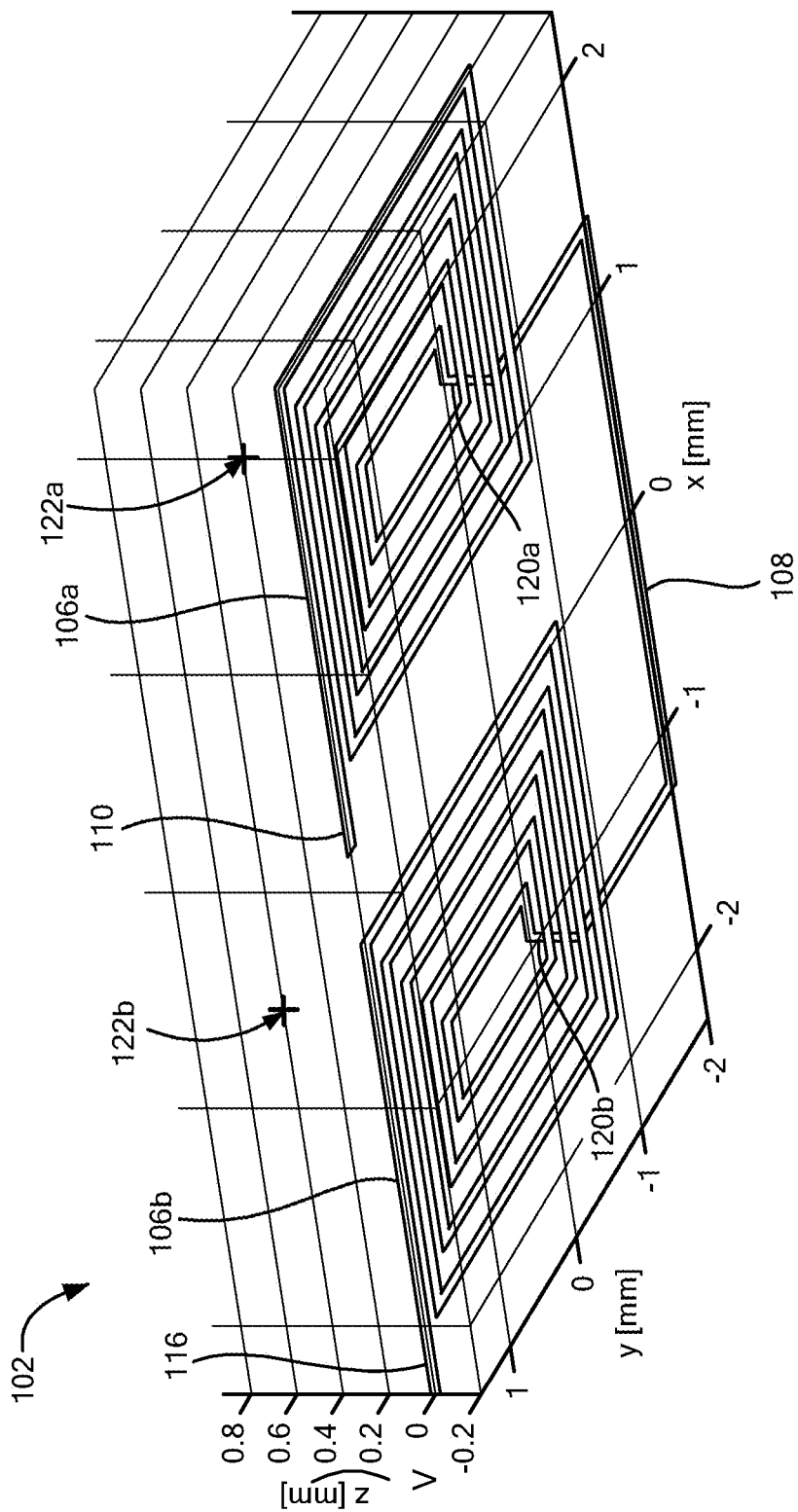
FIG. 1A is a diagram showing a perspective view of the dual coil structure included within the current sensor assembly of FIG. 1.

FIG. 1A shows a perspective view of the coil structure 102 of FIG. 1. The coil structure 102 may be formed on a PCB having two or more conductive layers (e.g., copper sheets) separated by one or more insulating layers (e.g., layers of non-conductive substrate). Two different conductive layers by interconnected by vias (i.e., plated-through holes) formed through one or more of the insulating layers. In more detail, first and second coils 106a, 106b may be formed on a first conductive layer of a PCB and return path 108 may be formed on a second conductive layer of the PCB. Thus, first and second coils 106a, 106b may be referred to as "planar coils" and coil structure 102 may be referred to as a "planar differential coil." Return path 108 can be connected to the first and second coils 106a and 106b by vias 120a and 120b, respectively. In some cases, coils 106a, 106b and return path 108 may be printed onto the conductive layers using a subtractive process. For example, coils 106a, 106b and return path 108 may be etched from copper sheets corresponding to the first and second conductive layers. In other cases, an additive printing process may be used. Copper is just one example of a conductive material that can be used to form coil structure 102 and various other conductive materials may be used. To promote clarity in the drawings, only the conductive elements 106a, 106b, 108, 120a, and 120b are shown in FIG. 1 and the remaining portions of the PCB are omitted.

The magnetic field sensing elements 104a and 104b of FIG. 1 may be disposed over the coil structure 102 at positions 122a and 122b, respectively. For example, positions 122a, 122b may correspond to center positions of Hall elements.

In the example of FIG. 1A, the magnetic field sensing element positions 122a, 122b have a position along the Z axis at approximate 0.9 mm, the first conductive layer onto which coils 106a, 106b is formed has a position along the Z axis of 0 mm, and the second conductive layer onto which return path 108 is formed has a position along the Z axis of −0.2 mm. The dimensions illustrated in FIG. 1A are merely illustrative and other dimensions may be used.

Figure 1B:
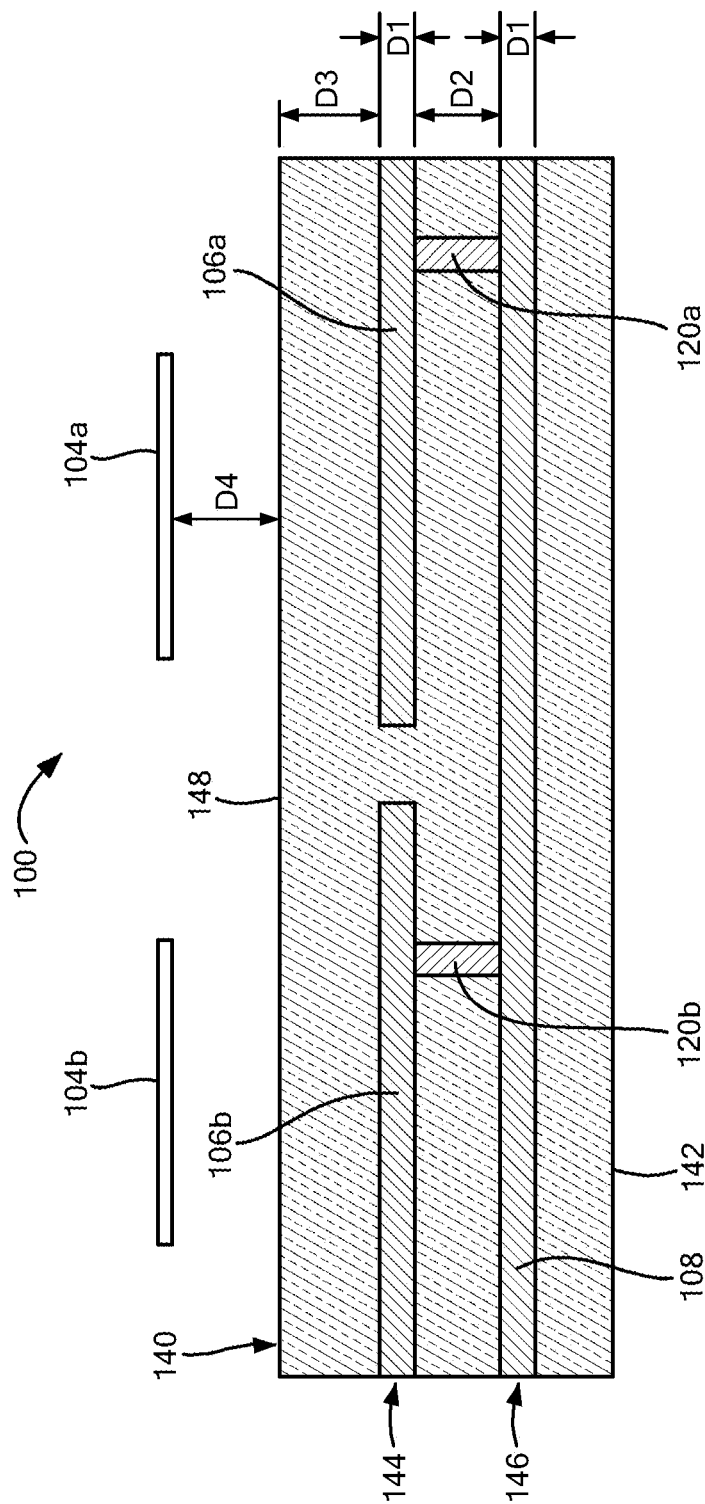
FIG. 1B is a diagram showing a side view of the current sensor assembly of FIG. 1.

FIG. 1B shows a side view of the current sensor assembly 100 of FIG. 1. As shown, a PCB 140 can include a substrate 142, a first conductive layer 144, and a second conductive layer 146. First and second coils 106a, 106b of the coil structure can be formed on the first conductive layer 144 and return path 108 may be formed on the second conductive layer 146. The PCB 140 can further include vias 120a, 120b that electrically connect coils 160a, 160b to return path 108.

The conductive layers 144, 146 can have a thickness D1 and may be spaced apart (e.g., vertically spaced) by a distance D2. The first conductive layer 144 may be spaced apart from a surface (e.g., a top surface) 148 of the PCB 140 by a distance D3. Magnetic field sensing elements 104a, 104b may be spaced apart from the surface 148 of the PCB 140 by a distance D4. As one example, D1 may be about 75 µm, D2 may be about 200 µm, D3 may be about 150 µm, and D4 may be about 750 µm. These dimensions are merely illustrative and other dimensions may be used.

The illustrative current sensor assembly 100, having a printed planar, winded coil structure on a PCB with the multiple surface mounted magnetic field sensing elements, can provide a higher magnetic coupling factor and signal-to-noise-ratio (SNR) compared to existing current sensor assemblies/designs. The low current to be measured flows through the coils to generates a relatively strong differential magnetic field that is applied to the magnetic field sensing elements. As such, current sensor assembly 100 provides a contactless, non-intrusive current sensing solution allowing for more accurate sensing of low currents (current flowing through the coil structure) while also being versatile and cost-effective by using simple coils structure directly printed on PCB. The structures and techniques disclosed herein can be used with various types of differential field sensors and magnetic sensor technologies (e.g., Hall, GMR, TMR, etc.).

FIG. 2 shows an example of a current sensor 200 that can be used within various current sensor assembly embodiments disclosed herein. For example, current sensor 200 can be provided within the current sensor assembly 100 of FIG. 1. The illustrative current sensor 200 can include first and second magnetic field sensing elements 204, 214 coupled to an electronic circuit 201. The magnetic field sensing elements 204, 214 can be coupled between a voltage source 202 and a ground or reference voltage. The first magnetic field sensing element 204 can generate a first differential signal 204a, 204b and the second magnetic field sensing element can generate a second differential signal 214a, 214b.

In some embodiments, the first differential signal 204a, 204b and the second differential signal 214a, 214b can be opposite signals, e.g., signals with opposite voltages. For example, if current sensor 200 is used within the assembly 100 of FIG. 1, the coil structure coil structure 102 may generate two magnetic fields having opposite directions, with first magnetic field sensing element 204 sensing one field and second magnetic field sensing element 214 sensing the other, oppositely-directed field. In other embodiments, first differential signal 204a, 204b and the second differential signal 214a, 214b may be independent signals, meaning the signals may be responsive to fields generated by two different currents. For example, current sensor 200 may be used to calculate a difference between two different currents within an assembly such as that described below in the context of FIG. 5. In this configuration, the current sensor may be referred to as a "differential current sensor."

In some embodiments, magnetic field sensing elements 204, 214 may be planar Hall elements. A planar Hall element can be a four terminal device having a square shape, from a top view. A voltage and ground can be applied to a pair of diagonally opposing terminals, respectively, and a differential voltage can be generated across the other pair of diagonally opposing terminals. In some applications, in order to reduce a DC offset voltage (voltage indicative of a magnetic field when no magnetic field is present), the pair of terminals selected for coupling to the voltage and ground, and the pair of terminals selected for the differential signal from the Hall element changes from time to time, generally at a high rate of change. There are four such coupling assemblies for a planar Hall element. When operating, the coupling assemblies can be referred to as current spinning.

Accordingly, the illustrative electronic circuit 201 can include a first current spinning circuit 206 coupled to receive the first differential signal 204a, 204b, which can come from first selected pairs of terminals of the first magnetic field sensing element 204. Not shown, the first current spinning circuit 206 can also control to which second pairs of terminals of the first magnetic field sensing element 204 the voltage 202 and ground are coupled in synchronous relationship with the first pairs of terminals. The first current spinning circuit 206 can generate a first spinning signal 206a. With the current spinning assembly, the first spinning signal can have two or more spectral parts, for which a desired baseband part can be indicative of a magnetic field sensed by the first magnetic field sensing 204 and a second higher frequency part can be indicative of the DC offset voltage. The spinning signal 206a can be coupled to a low pass filter 208 operable to generate a first filtered signal 208a that can include only the desired baseband part.

Elements 216 and 218 can operate in the same way as elements 206, 208, and can result in a second filtered signal 218a. In some embodiments, current spinning is not used and the current spinning circuits 206, 216 can be omitted. In some embodiments, low pass filters 208, 218, can be omitted.

A differencing circuit 210 can be coupled to the first and second filtered signals 208a, 218a, respectively, and can be operable to generate a difference signal 210a. An amplifier 212 can be coupled to the difference signal 210a and can be operable to generate an amplified difference signal 212a.

In embodiments where magnetic fields pass through the first and second magnetic field sensing elements, 208, 210 in opposite direction, and therefore generate opposite signals, differencing circuit 210 operates to combine the first and second filtered signals 208a, 218a constructively. In embodiments where different/independent magnetic fields magnetic fields pass through the first and second magnetic field sensing elements, 208, 210 (i.e., fields generated from two different or independent currents), differencing circuit 210 operates to calculate the difference between the first and second filtered signals 208a, 218a. That is, differencing circuit 210 can output a signal that is responsive to the difference between the two independent currents.

Figure 3:
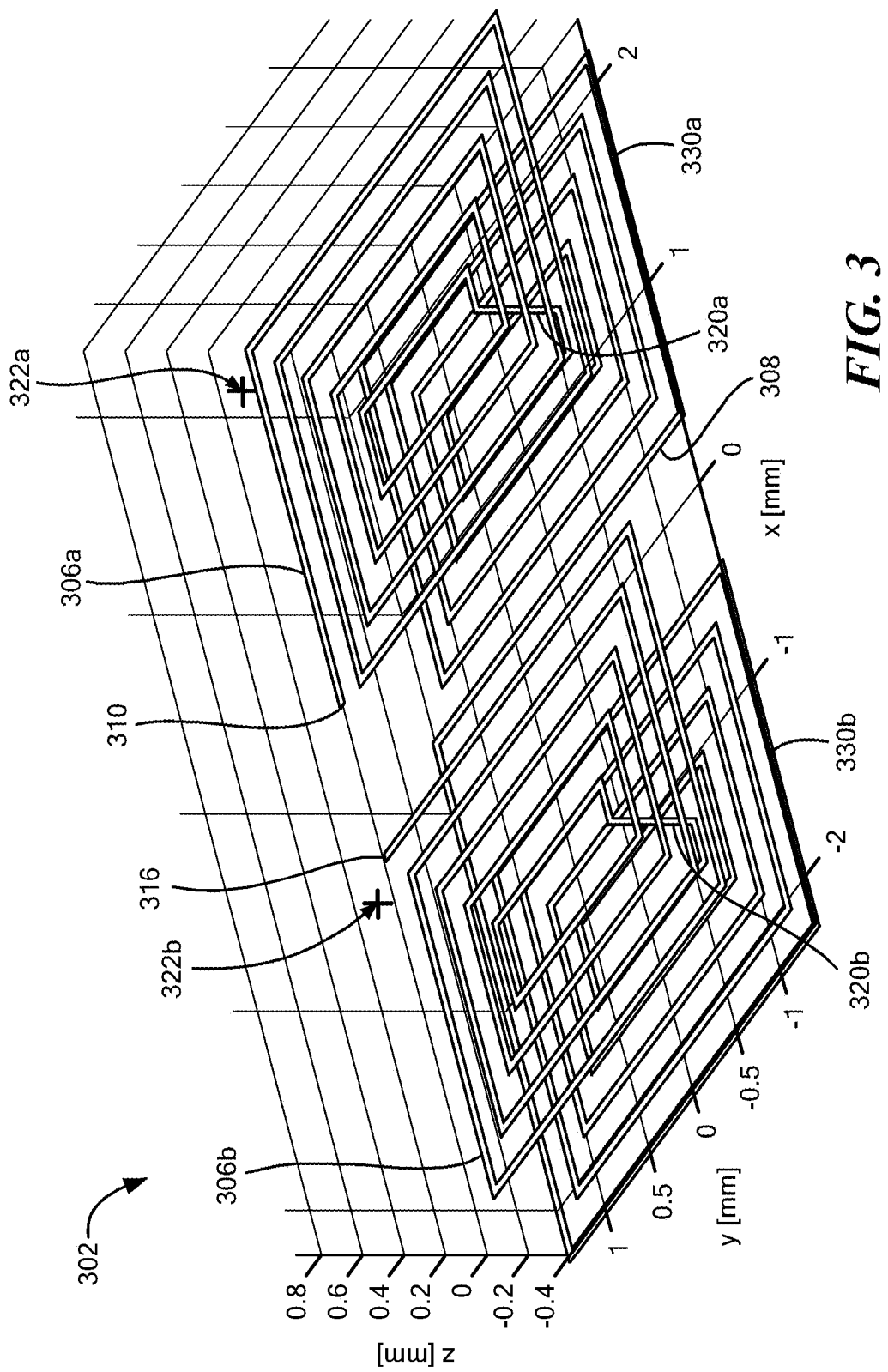
FIG. 3 is a diagram showing a perspective view of a quad coil structure that can be included within a current sensor assembly, according to embodiments of the present disclosure.

Turning to FIG. 3, embodiments of the present disclosure can utilize a quad coil structure to increase the magnetic coupling factor, resulting in higher magnetic field sensed and higher SNR. An illustrative coil structure 302 includes first and second coils 306a, 306b formed on a first layer (e.g., a first conductive layer of a PCB) and third and fourth coils 330a, 330b formed on a second layer (e.g., a second conductive layer of the PCB). The first and third coils 306a, 330a may be electrically connected by a first via 320a and the second and fourth coils 306a, 330b may be electrically connected by a second via 320b. The third and fourth coils 330a, 330b may be electrically connected by a return path 308, as shown. With this design, the second layer is not only used to inter-connect the left and right coils (i.e., first a second coils 406a, 306b) but also to provide another set of coils (i.e., third and fourth coils 330a, 330b) to increase the magnetic coupling factor.

The number of windings in the coils 306a, 306b, 330a, 330b, along with the dimensions and shapes of the windings, may be varied according to the requirements of a particular application. The illustrative coil structure 302 may be provided within various current sensor assemblies disclosed herein. For example, referring to the current sensor assembly 100 of FIG. 1, dual coil structure 102 may be replaced with quad coil structure 302 of FIG. 3.

Figure 4:
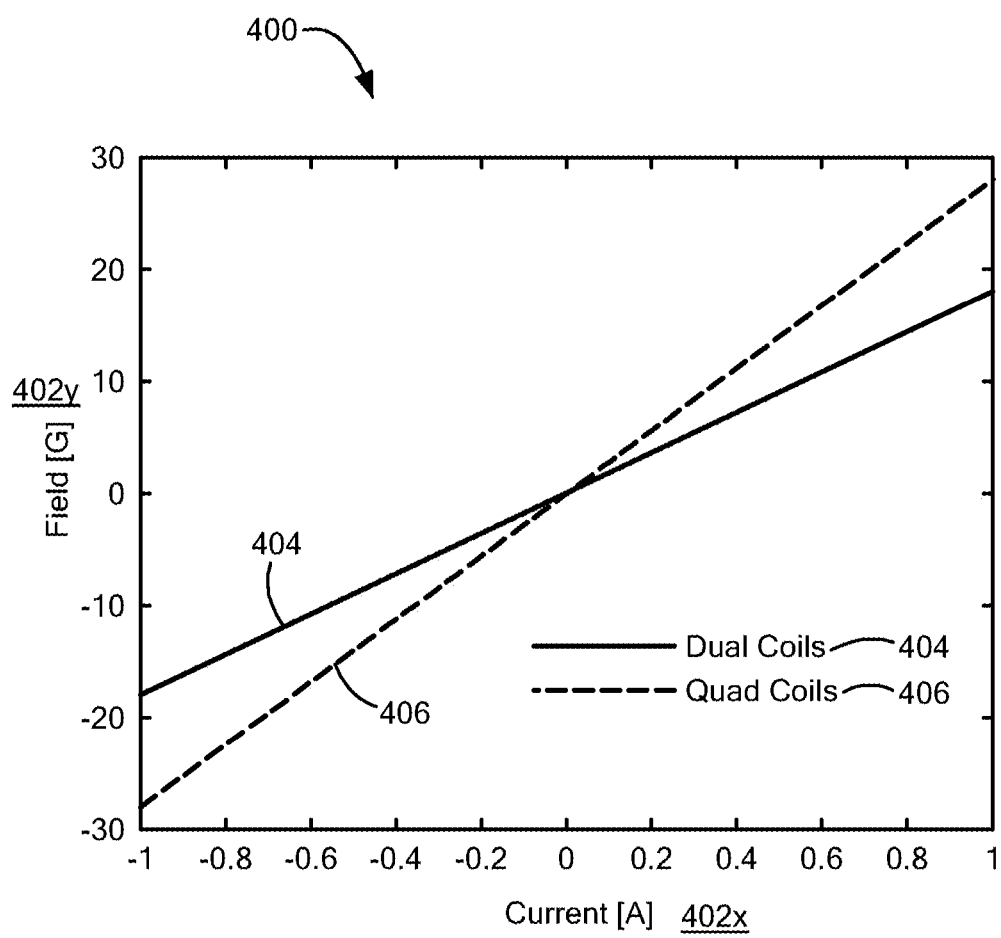
FIG. 4 is a plot showing magnetic fields that can be induced by a dual coil structure and a quad coil structure, according to embodiments of the present disclosure.

FIG. 4 is a plot showing magnetic fields that can be induced by a dual coil structure and a quad coil structure, according to embodiments of the present disclosure. Illustrative plot 400 includes a horizontal axis 402x representing current flowing through a particular coil structure (i.e., a current to be sensed) and a vertical axis 402y corresponding to the strength of the magnetic field generated for the current. A first curve 404 illustrates a magnetic coupling factor (G/A) for a dual coil structure (e.g., dual coil structure 102 of FIG. 1A) and a second curve 406 illustrates a magnetic coupling factor for a quad coil structure (e.g., quad coil structure 302 of FIG. 3). As shown by curve 404, a dual coil structure may achieve a magnetic coupling factor or about 18G/A and, as shown by curve 406, a quad coil structure may achieve a differential magnetic coupling factor or about 28G/A as seen by the sensor circuitry. Thus, in some cases, a quad coil structure formed on multiple layers of a PCB may increase the coupling factor and SNR, and thus allow for lower current to be sensed.

Figure 5:
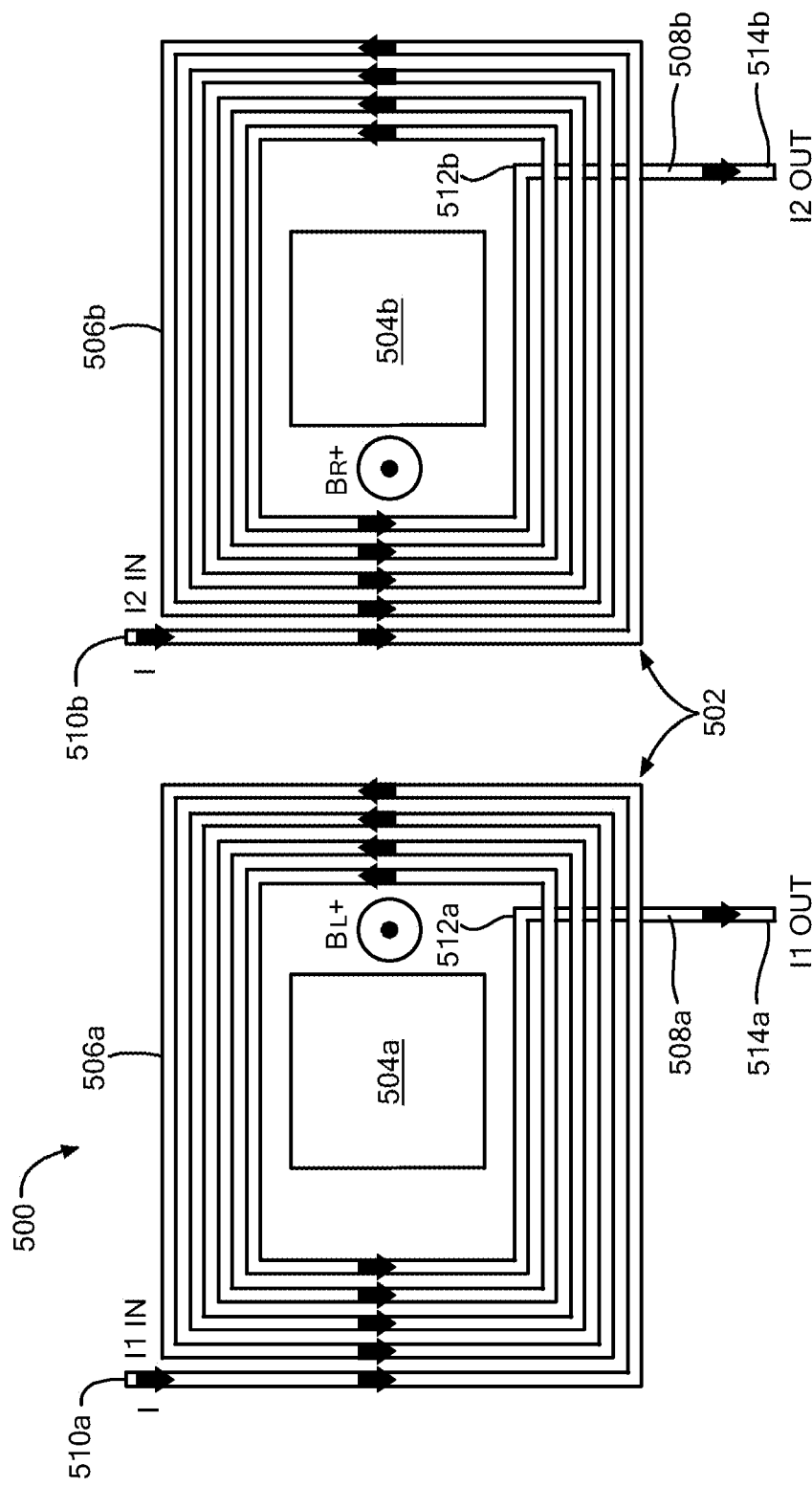
FIG. 5 is a diagram showing a top view of a current sensor assembly including a coil structure with two electrically separate coils and further including two magnetic field sensing elements disposed proximate thereto, according to embodiments of the present disclosure.

FIG. 5 shows another example of a current sensor assembly according to embodiments of the present disclosure. Current sensor assembly 500 can be used for differential current sensing, that is to calculate a difference between a first electrical current, $I_1$, and a second electrical current, $I_2$. Illustrative current sensor assembly 500 includes a coil structure 502 and two magnetic field sensing elements 504a, 504b disposed proximate thereto.

The illustrative coil structure 502 can include a first coil 506a electrically connected to a first return path 508a, and a second coil 506b electrically connected to a second return path 508b. The first and second coils 506a, 506a may be electrically separated or isolated from each other. The coils 506a, 506b and return paths 508a, 508b may be formed from any electrically conductive material, such as copper or another metal. As shown, first coil 506a may wind/loop one or more times in a counter-clockwise direction starting from a first input terminal 510a and ending at a first inner terminal 512a. One end of the first return path 508a may be connected to the first inner terminal 512a and the opposite end of the first return path 508a may correspond to a first output terminal 514a. Second coil 506b may wind/loop one or more times, also in a counter-clockwise direction, starting from a second input terminal 510b and ending at a second inner terminal 512b. One end of the second return path 508b may be connected to the second inner terminal 512b and the opposite end of the second return path 508b may correspond to a second output terminal 514b.

The number of windings in the first and second coils 506a, 506b, along with the dimensions and shapes of the windings, may be selected according to the requirements of a particular application in which the current sensor assembly 500 is to be used.

The first input terminal 510a and first output terminal 514a may constitute a first port that can be connected to external circuitry (e.g., a first current source) that carries the first current, $I_1$. The first current, $I_1$, can flow into the first input terminal 510a, counter-clockwise through the first coil 506a, through the first return path 508a, and out of the first output terminal 514a. Likewise, second input terminal 510b and second output terminal 514b may constitute a second port that can be connected to external circuitry (e.g., a second current source) that carries the second current, $I_2$. The second current, $I_2$, can flow into the second input terminal 510b, counter-clockwise through the second coil 506b, through the second return path 508b, and out of the second output terminal 514b. The currents flowing through the first and second coils 506a, 506b can generate respective first and second magnetic fields $B_L$, $B_R$ both having the same direction (e.g., out from the page of FIG. 5). In some embodiments, the direction of current flow—and thus the directions of the magnetic fields—may be reversed.

Magnetic field sensing elements 504a, 504b may be configured to generate signals responsive to magnetic fields $B_L$, $B_R$ respectively. Magnetic field sensing elements 504a, 504b may have axes of sensitivity perpendicular to the page of FIG. 5. In some embodiments, magnetic field sensing elements 504a, 504b may be provided as Hall elements, such as planar Hall elements.

Magnetic field sensing elements 504a, 504b may be provided as part of a current sensor that includes an electronic circuit (not shown), all disposed upon a common substrate (also not shown). The circuit may be operable to receive the first signal generated by the first magnetic field sensing element 504a and the second signal generated by the second magnetic field sensing element 504b, and to generate an output signal proportional to a difference between the first current, $I_1$, and the second current, $I_2$. That is, current sensor assembly 500 can perform differential current sensing, where the differential field sensed $B_L-B_R$ is proportional to the difference $I_1-I_2$. The current sensor circuit may be configured to perform other signal processing, such as current spinning, filtering, an amplification. FIG. 2 shows an example of a current sensor within which magnetic field sensing elements 504a, 504b may be provided. That is, the illustrative current sensor of FIG. 2 may be included within the assembly 500.

In some embodiments, coil structure 502 may be formed upon or within a PCB. In more detail, first and second coils 506a, 506b may be formed on a first conductive layer of the PCB and first and second return paths 508a, 508b may be formed on a second conductive layer of the PCB. First return path 508a may be connected to the inner terminal 512a of the first coil 506a by a first via and second return path 508b may be connected to the inner terminal 512b of the second coil 506b by a second via. The vias are not visible in the top view of FIG. 5. The magnetic field sensing elements 504a, 504b and the sensor circuitry may be formed on a die and packaged within an IC package. The current sensor package may be disposed over the PCB to form the current sensor assembly 500. For example, the current sensor package may be surface mounted over the PCB using adhesive or mechanical fasteners.

The illustrative current sensor assembly 500 may be used in a variety of differential current sensing applications. As one example, current sensor assembly 500 may be used to detect for a current leak in a system having a battery. First coil 506a can be connected within the system such that $I_1$ corresponds to the current flowing out of the battery, and second coil 506b can be connected such that $I_2$ corresponds to the current flowing back to the battery. An imbalance between $I_1$ and $I_2$ may indicate a current leak in the system, a potentially dangerous condition. The output of the current sensor assembly-which is proportional or otherwise responsive to $I_1-I_2$—can be compared to a threshold value, T, to determine if a current leak exists.

Figure 6:
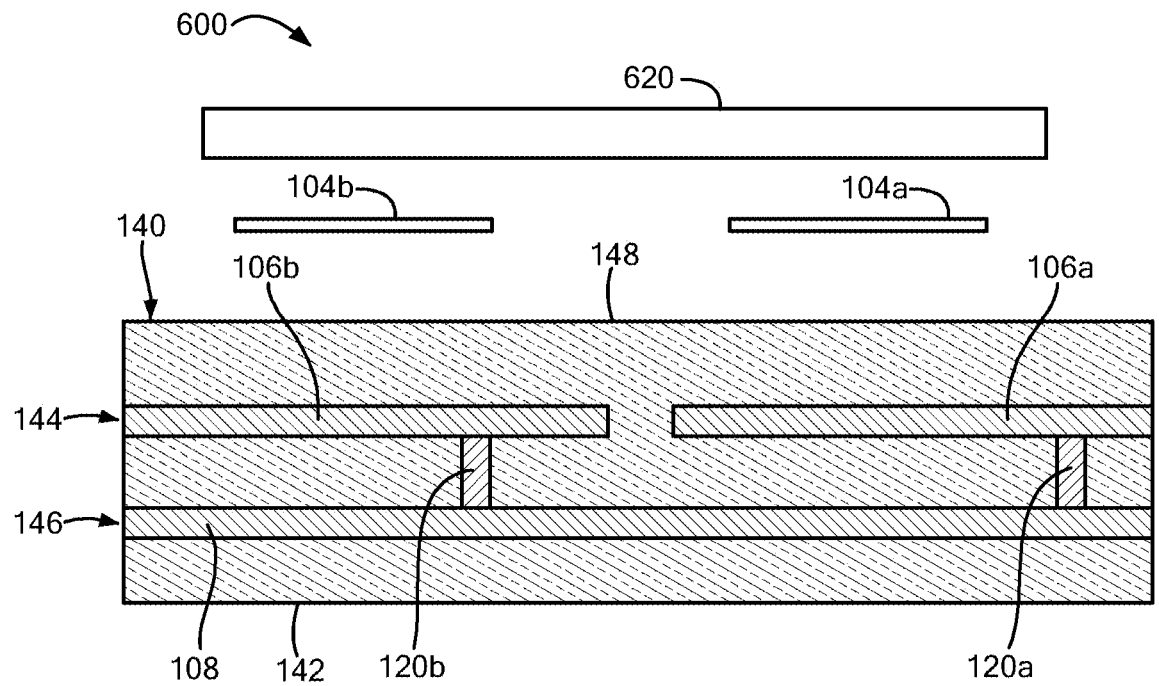
FIG. 6 is a diagram showing a side view of a current sensor assembly including a dual coil structure, two magnetic field sensing elements disposed proximate thereto, and a single magnetic flux concentrator, according to embodiments of the present disclosure.
Figure 7:
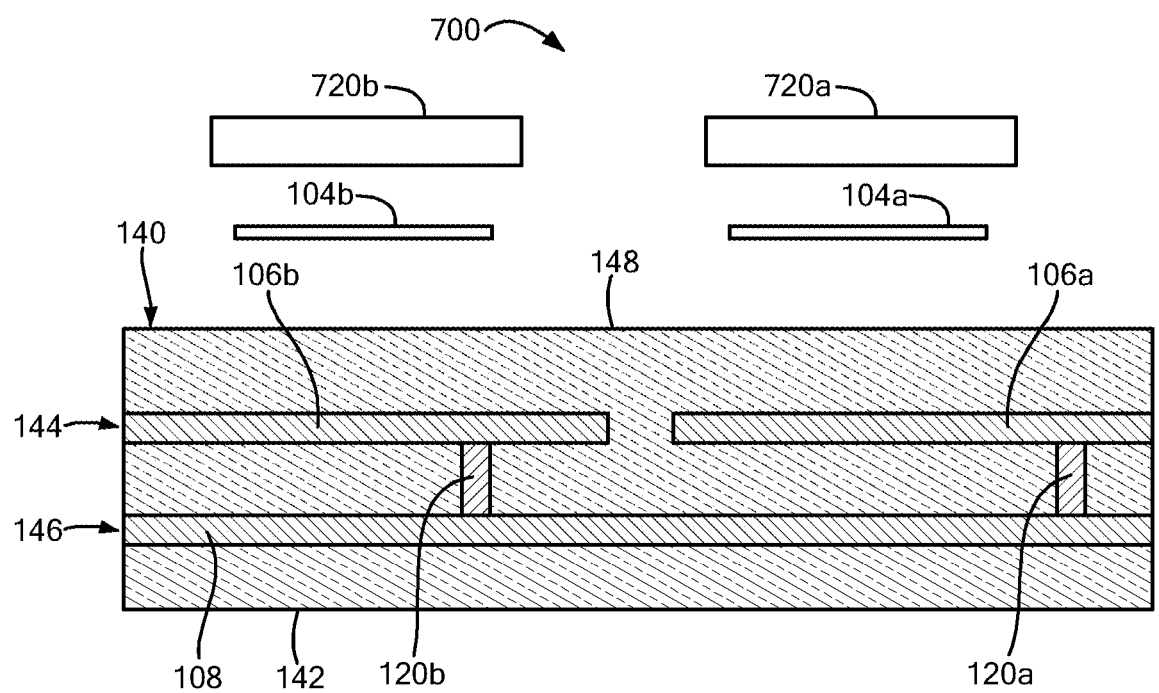
FIG. 7 is a diagram showing a side view of a current sensor assembly including a dual coil structure, two magnetic field sensing elements disposed proximate thereto, and two magnetic flux concentrators, according to embodiments of the present disclosure.

Turning to FIGS. 6 and 7, one or more magnetic field concentrators may be integrated into disclosed currently sensor assembly embodiments to further increase the magnetic coupling factor and allow for sensing of lower currents. The magnetic field concentrators may be the same as or similar to any of the magnetic field concentrators shown or described in U.S. Pat. No. 11,099,217, which issued on Aug. 24, 2021, is entitled "Current sensor having a flux concentrator for redirecting a magnetic field through two magnetic field sensing elements," and the entire contents of which are herein incorporated by reference. The examples of FIGS. 6 and 7 are based on the current sensor assembly 100 of FIG. 1B. Like elements of FIG. 1B are identified by like reference numerals in FIGS. 6 and 7 and, for brevity, such like elements are generally not discussed again hereinbelow.

FIG. 6 shows a side-view of a current sensor assembly 600 having a single magnetic field concentrator 620 positioned above magnetic field sensing elements 104a, 104b, which are themselves positioned above the coils 106a, 106b that generate the field to be sensed. The composition, dimensions, and position of the magnetic field concentrator 620 can be selected to concentrate and redirect (or "influence") magnetic flux lines generated by the coils 106a, 106b downward toward magnetic field sensing elements 104a, 104b and in the direction of their axes of maximum sensitivity to further improve SNR. In some embodiments, magnetic flux concentrator 620 can be a comprised of a plurality of high permeability layers in order to be less impacted by any eddy currents that may occur within the magnetic flux concentrator 620. This can improve the accuracy of the current sensor assembly 600 when eddy currents are experienced, i.e. when sufficiently high frequency AC currents flow through the coils 106a, 106b.

FIG. 7 shows a side-view of a current sensor assembly 700 having two magnetic field concentrators 720a, 720a positioned above corresponding ones of the two magnetic field sensing elements 104a, 104b, which are themselves positioned above the coils 106a, 106b that generate the field to be sensed. The composition, dimensions, and position of the magnetic field concentrators 720a, 720b can be selected to concentrate and redirect magnetic flux lines generated by the respective coils 106a, 106b downward toward the respective magnetic field sensing elements 104a, 104b and in the direction of their respective axes of maximum sensitivity. Having separate magnetic field concentrators 720a, 720a for each of the magnetic field sensing elements 104a, 104b can further improve the accuracy of the current sensor assembly when eddy currents are experienced.

Figure 8:
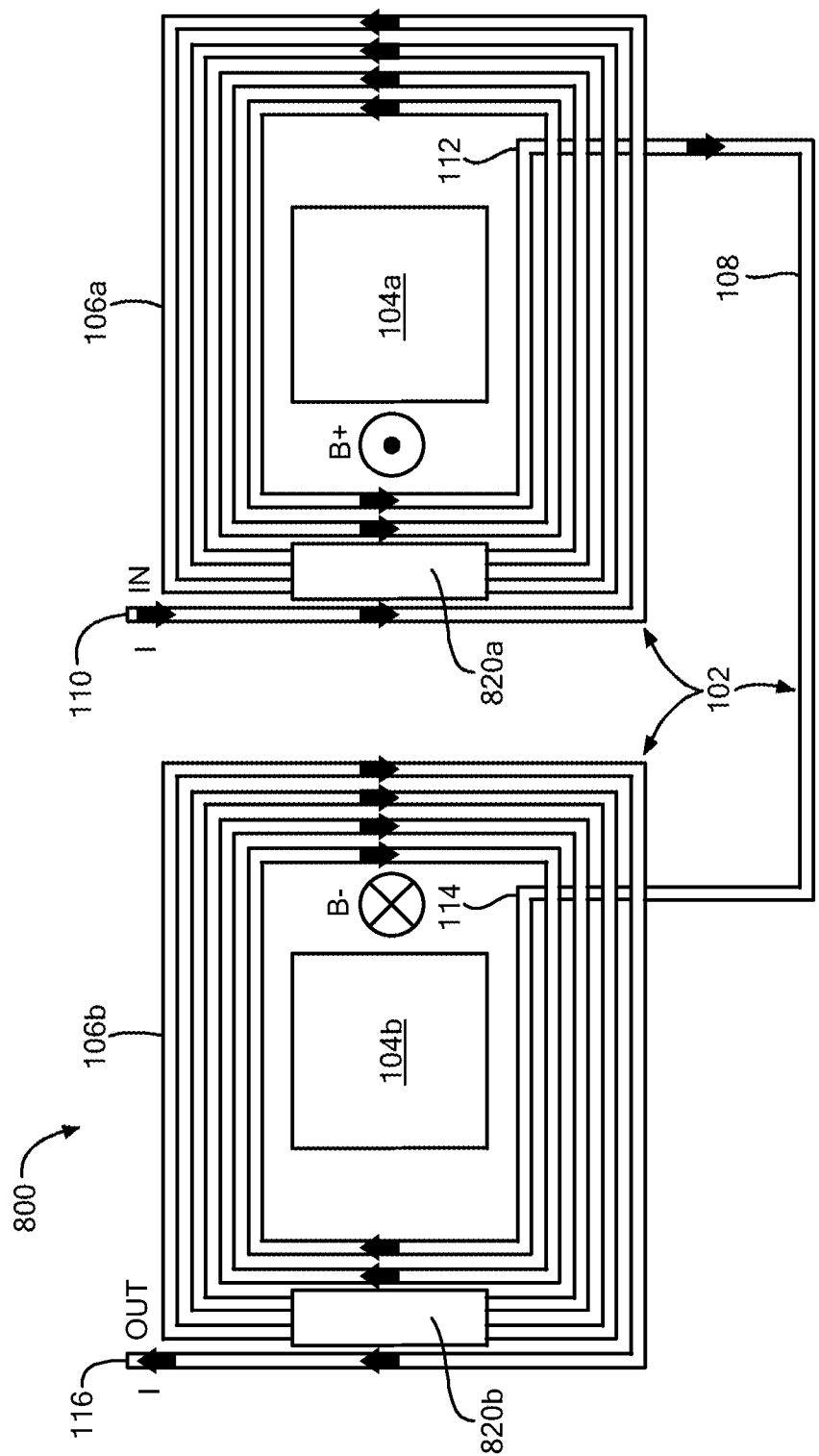
FIG. 8 is a diagram showing a top view of a current sensor assembly including a dual coil structure and four magnetic field sensing elements disposed proximate thereto, according to embodiments of the present disclosure.

Turning to FIG. 8, in some embodiments, additional magnetic field sensing elements can be used to achieve redundancy and/or for diagnostic purposes. As seen in the example of FIG. 8, a current sensor assembly 800 can include a third magnetic field sensing element 820a disposed proximate to first coil 106a and a fourth magnetic field sensing element 820b disposed proximate to second coil 106b. The example of FIG. 8 is based on the current sensor assembly 100 of FIG. 1. Like elements of FIG. 1 are identified by like reference numerals in FIG. 8 and, for brevity, such like elements are generally not discussed again herein.

In some embodiments, the third and fourth magnetic field sensing elements 820a, 820b may be vertical Hall elements. As shown, vertical Hall elements 820a, 820b may be positioned off-center of the coil structures 106a, 106b where the generated field has significant components parallel to the substrate (in contrast to the center of the coils where the generated field is dominantly perpendicular to the substrate). Using magnetic field sensing elements to sense in multiple different orientations can provide redundancy and additional versatility. In other embodiments, GMR, TMR, or AMR elements may be used.

The third and fourth magnetic field sensing elements 820a, 820b may be connected to the same circuit as first and second magnetic field sensing elements 104a, 104b, or they may be connected to a separate circuit. As an example, the circuitry illustrated in FIG. 2 may be duplicated for each pair of sensing elements such that the current sensor assembly 800 provides two output signals, i.e., one signal in response to the field sensed by first and second magnetic field sensing elements 104a, 104b and another signal in response to the field sensed by third and fourth magnetic field sensing elements 820a, 820b.

Figure 9:
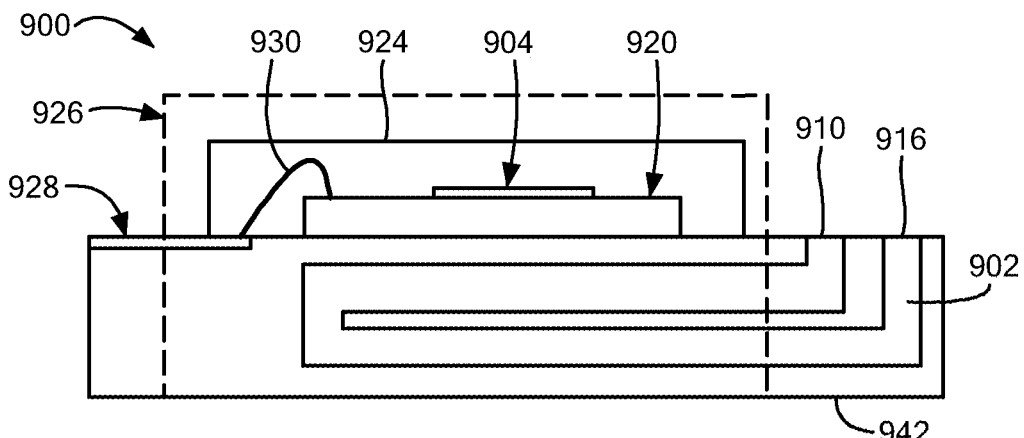
FIG. 9 is a diagram showing a side view of a current sensor assembly having a die and a coil structure formed as a single module, according to embodiments of the present disclosure.

FIG. 9 shows an example of a current sensor assembly having a die and a coil structure formed as a single module or package, according to embodiments of the present disclosure. That is, whereas other embodiments described herein may have the coils structure formed on a PCB and attached to a separate IC package, FIG. 9 illustrates a technique for combining these elements into a single module or package.

An illustrative current sensor assembly 900 includes a coil structure 902 formed within a substrate 942 and a current sensor 924 having an IC 920 and one or more magnetic field sensing elements 904. The IC 920 and magnetic field sensing elements 904 may be provided as a "bare die," meaning a die that is not packaged. Box 924 can represents an optional physical structure (i.e., package) protecting the bare die. Substrate 942 can support coil connections 910, 916 for connecting to input and output terminals of the coil structure 902, and IC connections 928 for connecting to the IC 920 via one or more leads 930 within the current sensor 924. The current sensor 924 can be overmolded onto the substrate 942 using, for example, an injection molding process. The resulting overmolded structure or module is illustrated by dashed line 926. Of note, the coil connections 910, 916 and the IC connections 928 are left exposed by the overmolding process.

Coil structure 902 may be the same as or similar to various other coil structures disclosed herein, such as coil structure 102 of FIG. 1, coil structure 302 of FIG. 3, or coil structure 502 of FIG. 5. In some embodiments, the substrate 942 may correspond to a PCB substrate and the coil structure 902 may be formed on one or more conductive layers of the PCB. In some embodiments, the substrate 942 may correspond to a substrate of a standalone (or "mini") PCB. In some embodiments, coil structure 902 may be replaced by a conductive loop such as that illustrated in FIG. 11.

In some embodiments, the coil structure 902 may be formed to the front side or back side of the bare die providing IC 920. For example, micro winded coils can be printed on to the front or back side of the bare die.

Figure 10:
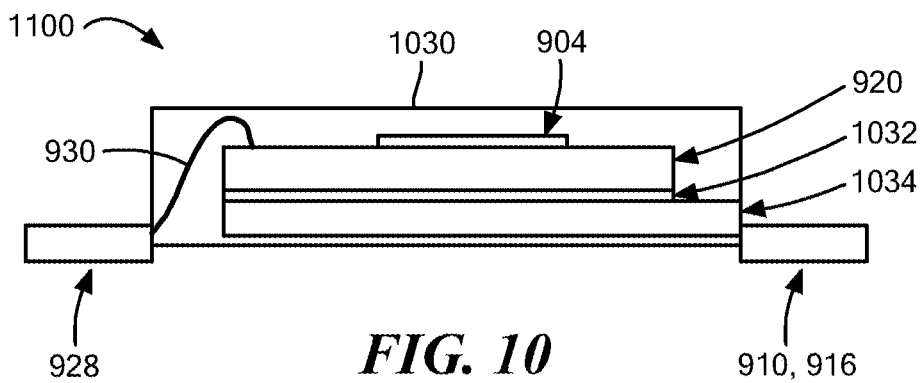
FIG. 10 is a diagram showing a side view of a current sensor assembly including a conductive coil or loop structure integrated into a current sensor package, according to embodiments of the present disclosure.

FIG. 10 shows an example of a current sensor assembly having a conductive coil or loop structure integrated into a current sensor package, according to embodiments of the present disclosure. Like elements of FIG. 9 are identified by like reference numerals in FIG. 10.

An illustrative coil sensor assembly 1000 includes a current sensor package 1030 having the IC 920, one or more magnetic field sensing elements 904, a passivation and isolation layer 1032, and a conductive coil or loop structure 1034. The current sensor package 1030 also has IC connections 928 and coil (or conductive loop) connections 910, 916. The conductive coil or loop structure 1034 can be integrated in the current sensor package 1030 at a lead frame level or below it to provide an integrated low current sensor device.

Figure 11:
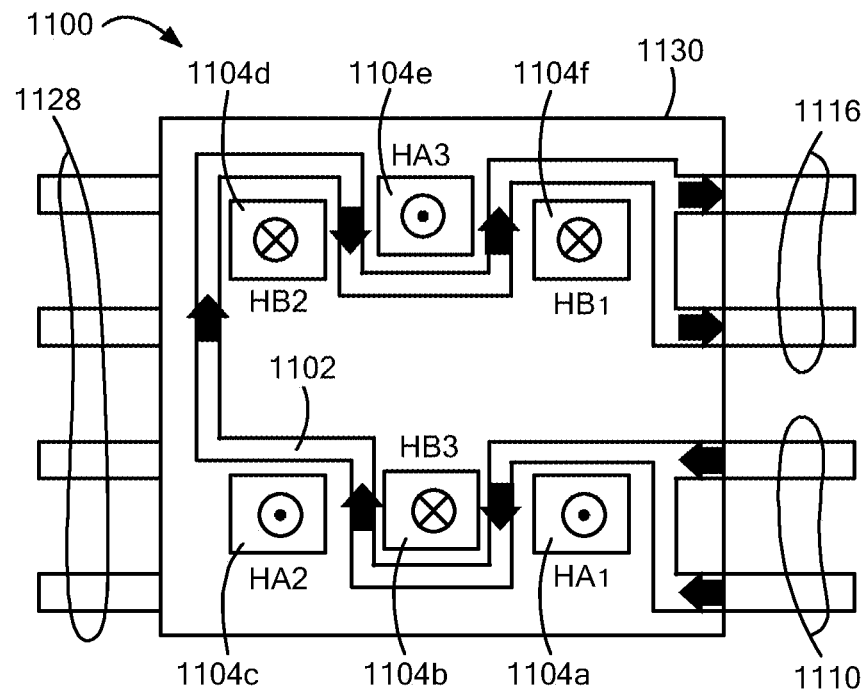
FIG. 11 is a diagram showing a top view of a current sensor assembly including a conductive loop structure integrated into a current sensor package, according to embodiments of the present disclosure.

FIG. 11 shows an example of a current sensor assembly including a conductive loop structure integrated into a current sensor package, according to embodiments of the present disclosure. An illustrative current sensor assembly 1100 includes a conductive loop structure (or "conductive loop" for short) 1102 and magnetic field sensing elements 1104a, 1104b, 1104c, 1104d, 1104e, 1104f (1104, generally) formed within a current sensor package 1130. The current sensor package 1130 can also have circuitry (not shown) for processing the signals generated by the magnetic field sensing elements 1104 and IC connections 1128 for connecting to said circuitry. The current sensor package 1130 can further have one or more input terminals 1110 and one or more output terminals 1116 for connecting to opposite ends of the conductive loop 1102.

As shown in the example of FIG. 11, the magnetic field sensing elements 1104 may be arranged in differential pairs, with elements 1104a, 1104f forming a first pair, elements 1104b, 1104e forming a second pair, and elements 1104c, 1104d forming a third pair. Other numbers are arrangements of magnetic field sensing elements 1104 may be used. The conductive loop 1102 may be arranged to generate magnetic fields with alternating directions for different ones of the magnetic field sensing elements 1104 in response to a current flowing through the conductive loop 1102. For example, as shown in FIG. 11, assuming that a current flows from input terminals 1110 to output terminals 1116, conductive loop 1102 may generate a magnetic field directed out of the page for elements 1104a, 1104c, and 1104e, and a magnetic field directed into the page for elements 1104b, 1104d, and 1104f. In some embodiments, magnetic field sensing elements 1104 may be planar Hall elements.

Each of the pairs of magnetic field sensing elements may be connected to a differential current sensor circuit (e.g., a circuit similar to that of FIG. 2) to provide multiple output signals each responsive to the current. In the example of FIG. 11, elements 1104a, 1104f may be connected to a first differential sensing circuit, elements 1104b, 1104e may be connected to a second differential sensing circuit, and elements 1104c, 1104d may be connected to a third differential sensing circuit, resulting in three separate output signals. Having different pairs of sensing elements connected to different differential circuit can provide redundancy and improved safety. In other embodiments, two or more pairs of sensing elements can be connected to the same differential circuit. For example, sensing elements 1004a, 1004c, and 1004e may be connected together to provide a first combined signal and sensing elements 1004b, 1004d, and 1004f may be connected together to provide a second combined signal. The two combined signals may them be used as a differential input to a circuit that is the same as or similar to circuit 201 of FIG. 2.

With the layout of FIG. 11, the corresponding magnetic coupling factor (G/A) can be given by the following equation:

$$CFdiff = \frac{(HA_1 + HA_2 + HA_3)}{3} - \frac{(HB_1 + HB_2 + HB_3)}{3},$$

in which $HA_1$, $HB_3$, $HA_2$, $HB_2$, $HA_3$, and $HB_1$ correspond to the coupling factors of magnetic field sensing elements 1104a, 1104b, 1104c, 1104d, 1104e, and 1104f, respectively. This equation can be adapted for other numbers of magnetic field sensing elements by changing the terms in the numerators and the constant in the denominators.

Embodiments of the integrated current sensor assembly illustrated in FIG. 11 can be used for sensing low currents while providing stray field immunity as a result of differential sensing.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Various embodiments of the concepts systems and techniques are described herein with reference to the related drawings. Alternative embodiments can be devised without departing from the scope of the described concepts. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to element or structure A over element or structure B include situations in which one or more intermediate elements or structures (e.g., element C) is between elements A and B regardless of whether the characteristics and functionalities of elements A and/or B are substantially changed by the intermediate element(s).

Furthermore, it should be appreciated that relative, directional or reference terms (e.g. such as "above," "below," "left," "right," "top," "bottom," "vertical," "horizontal," "front," "back," "rearward," "forward," etc.) and derivatives thereof are used only to promote clarity in the description of the figures. Such terms are not intended as, and should not be construed as, limiting. Such terms may simply be used to facilitate discussion of the drawings and may be used, where applicable, to promote clarity of description when dealing with relative relationships, particularly with respect to the illustrated embodiments. Such terms are not, however, intended to imply absolute relationships, positions, and/or orientations. For example, with respect to an object or structure, an "upper" or "top" surface can become a "lower" or "bottom" surface simply by turning the object over. Nevertheless, it is still the same surface and the object remains the same. Also, as used herein, "and/or" means "and" or "or," as well as "and" and "or." Moreover, all patent and non-patent literature cited herein is hereby incorporated by references in their entirety.

The terms "disposed over," "overlying," "atop," "on top," "positioned on" or "positioned atop" mean that a first element, such as a first structure, is present on a second element, such as a second structure, where intervening elements or structures (such as an interface structure) may or may not be present between the first element and the second element. The term "direct contact" means that a first element, such as a first structure, and a second element, such as a second structure, are connected without any intermediary elements or structures between the interface of the two elements. The term "connection" can include an indirect connection and a direct connection.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

References in the disclosure to "one embodiment," "an embodiment," "some embodiments," or variants of such phrases indicate that the embodiment(s) described can include a particular feature, structure, or characteristic, but every embodiment can include the particular feature, structure, or characteristic. Moreover, such phrases are not necessarily referring to the same embodiment(s). Further, when a particular feature, structure, or characteristic is described in connection knowledge of one skilled in the art to affect such feature, structure, or characteristic in connection with other embodiments whether or not explicitly described.

The disclosed subject matter is not limited in its application to the details of construction and to the assemblies of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

What is claimed is:

1. A current sensor assembly comprising:
    a first coil disposed on or in a substrate and configured to generate a first magnetic field responsive to a first electrical current passing through the first coil;
    a second coil disposed on or in the substrate and configured to generate a second magnetic field responsive to a second electrical current passing through the second coil;
    a first magnetic field sensing element disposed proximate to the first coil and operable to generate a first signal responsive to the first magnetic field;
    a second magnetic field sensing element disposed proximate to the second coil and operable to generate a second signal responsive to the second magnetic field;
    a differential circuit operable to combine the first and second signals to generate a differential signal proportional to a combination of the first electrical current and the second electrical current;
    a third magnetic field sensing element disposed proximate to the first coil and operable to generate a third signal responsive to the first magnetic field passing through the third magnetic field sensing element; and
    a fourth magnetic field sensing element disposed proximate to the second coil and operable to generate a fourth signal responsive to the second magnetic field passing through the fourth magnetic field sensing element;
    wherein the differential circuit is further operable to generate the differential signal using the third and fourth signals.

2. The current sensor assembly of claim 1, wherein the first and second coils are connected in series.

3. The current sensor assembly of claim 1, wherein the first and second coils are electrically separate and wherein the differential circuit is configured to generate a differential signal proportional to a difference between the first electrical current and the second electrical current.

4. The current sensor assembly of claim 1, wherein the first and second magnetic field sensing elements are disposed in an integrated circuit (IC) disposed on the substrate.

5. The current sensor assembly of claim 1, wherein the first and second magnetic field sensing elements comprise magneto resistance (xMR) elements.

6. The current sensor assembly of claim 5, wherein the xMR elements comprise tunneling magnetoresistance (TMR) elements.

7. The current sensor assembly of claim 5, wherein the xMR elements comprise giant magnetoresistance (GMR) elements.

8. The current sensor assembly of claim 5, wherein the xMR elements comprise anisotropic magnetoresistance (AMR) elements.

9. The current sensor assembly of claim 1, wherein the first and second magnetic field sensing elements comprises Hall effect elements.

10. The current sensor assembly of claim 1, wherein the third and fourth magnetic field sensing elements comprise Hall effect elements.

11. The current sensor assembly of claim 1, wherein the third and fourth magnetic field sensing elements comprise magnetoresistance (xMR) elements.

12. The current sensor assembly of claim 1, further comprising one or more magnetic flux concentrators configured to influence the first magnetic field to pass through the first magnetic field sensing element and/or to influence the second magnetic field to pass through the second magnetic field sensing element.

13. The current sensor assembly of claim 12, wherein the one or more magnetic flux concentrators include a first magnetic flux concentrator disposed proximate to the first magnetic field sensing element and a second magnetic flux concentrator disposed proximate to the second magnetic field sensing element.

14. The current sensor assembly of claim 12, wherein the one or more magnetic flux concentrators include a single magnetic flux concentrator disposed proximate to both the first and second magnetic field sensing elements.

15. The current sensor assembly of claim 1, wherein the substrate comprises a PCB.

16. The current sensor assembly of claim 1, wherein the differential circuit is disposed in a die disposed on the substrate.

17. The current sensor assembly of claim 16, wherein the die comprises a packaged die.

18. The current sensor assembly of claim 1, wherein the first and second magnetic field sensing elements are disposed in a die disposed on the substrate.

19. The current sensor assembly of claim 1, wherein substrate, the differential circuit, and the first and second magnetic field sensing elements, are disposed within an integrated circuit (IC) package.

* * * * *